United States Patent
Lai et al.

(10) Patent No.: US 12,034,009 B2
(45) Date of Patent: Jul. 9, 2024

(54) SEMICONDUCTOR DEVICE SEGMENTED INTERCONNECT

(71) Applicant: TAIWAN SEMICONDUCTOR MANUFACTURING COMPANY, LTD., Hsinchu (TW)

(72) Inventors: Chih-Yu Lai, Hsinchu (TW);
Chih-Liang Chen, Hsinchu (TW);
Ching-Wei Tsai, Hsinchu (TW);
Shang-Wen Chang, Hsinchu (TW);
Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 263 days.

(21) Appl. No.: 17/463,022

(22) Filed: Aug. 31, 2021

(65) Prior Publication Data
US 2023/0067952 A1    Mar. 2, 2023

(51) Int. Cl.
| | | |
|---|---|---|
| *H01L 27/12* | (2006.01) | |
| *H01L 21/768* | (2006.01) | |
| *H01L 21/822* | (2006.01) | |
| *H01L 21/8234* | (2006.01) | |
| *H01L 23/48* | (2006.01) | |
| *H01L 23/528* | (2006.01) | |
| *H01L 23/535* | (2006.01) | |
| *H01L 27/06* | (2006.01) | |
| *H01L 27/088* | (2006.01) | |
| *H01L 29/423* | (2006.01) | |
| *H01L 29/786* | (2006.01) | |

(52) U.S. Cl.
CPC ...... *H01L 27/124* (2013.01); *H01L 21/76898* (2013.01); *H01L 23/481* (2013.01); *H01L 27/1259* (2013.01)

(58) Field of Classification Search
CPC ............. H01L 27/124; H01L 21/76898; H01L 23/481; H01L 27/1259; H01L 21/76895; H01L 21/823475; H01L 23/5286; H01L 23/535; H01L 27/088; H01L 21/8221; H01L 21/823418; H01L 29/78618; H01L 27/0688; H01L 29/42392; H01L 29/78696; H01L 21/823431; H01L 21/823481; H01L 27/0886
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2015/0278429 A1 | 10/2015 | Chang | |
| 2016/0197069 A1* | 7/2016 | Morrow | H01L 27/0886 257/393 |
| 2017/0365600 A1* | 12/2017 | Sinha | H01L 24/73 |
| 2021/0242205 A1* | 8/2021 | Wu | H01L 27/0922 |

* cited by examiner

*Primary Examiner* — Herve-Louis Y Assouman
(74) *Attorney, Agent, or Firm* — Hauptman Ham, LLP

(57) ABSTRACT

A semiconductor device includes a base isolation layer, a first transistor with a first source electrode at a first side of the base isolation layer. A bridge pillar extends through the base isolation layer, and a metal electrode electrically connects the bridge pillar to the first source electrode. The metal electrode and the first source electrode are at the same side of the base isolation layer. A second metal electrode at an opposite side of the base isolation layer electrically connects to the bridge pillar and to a conductive line at the second side of the base isolation layer.

20 Claims, 15 Drawing Sheets

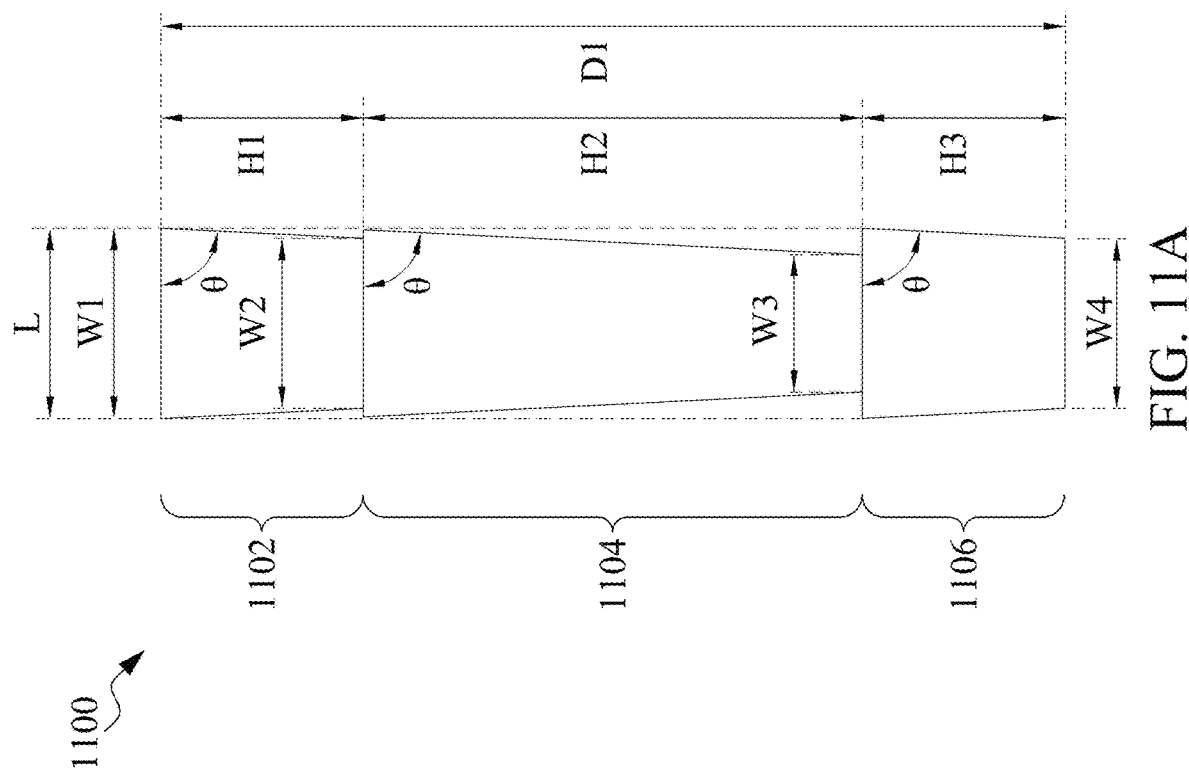

SEMICONDUCTOR DEVICE SEGMENTED INTERCONNECT

BACKGROUND

Semiconductor manufacturing involves designing semiconductor devices which have smaller device features and greater transistor density in sequential generations. Increasing transistor density and decreasing dimensions of device features (transistor lengths, contact dimensions, line widths, and so forth) introduces increased risk for manufacturing defects to have larger influence on device performance and functionality.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-11B are cross-sectional views of an interconnect structure of a semiconductor device in accordance with some embodiments.

DETAILED DESCRIPTION

Figure 1:
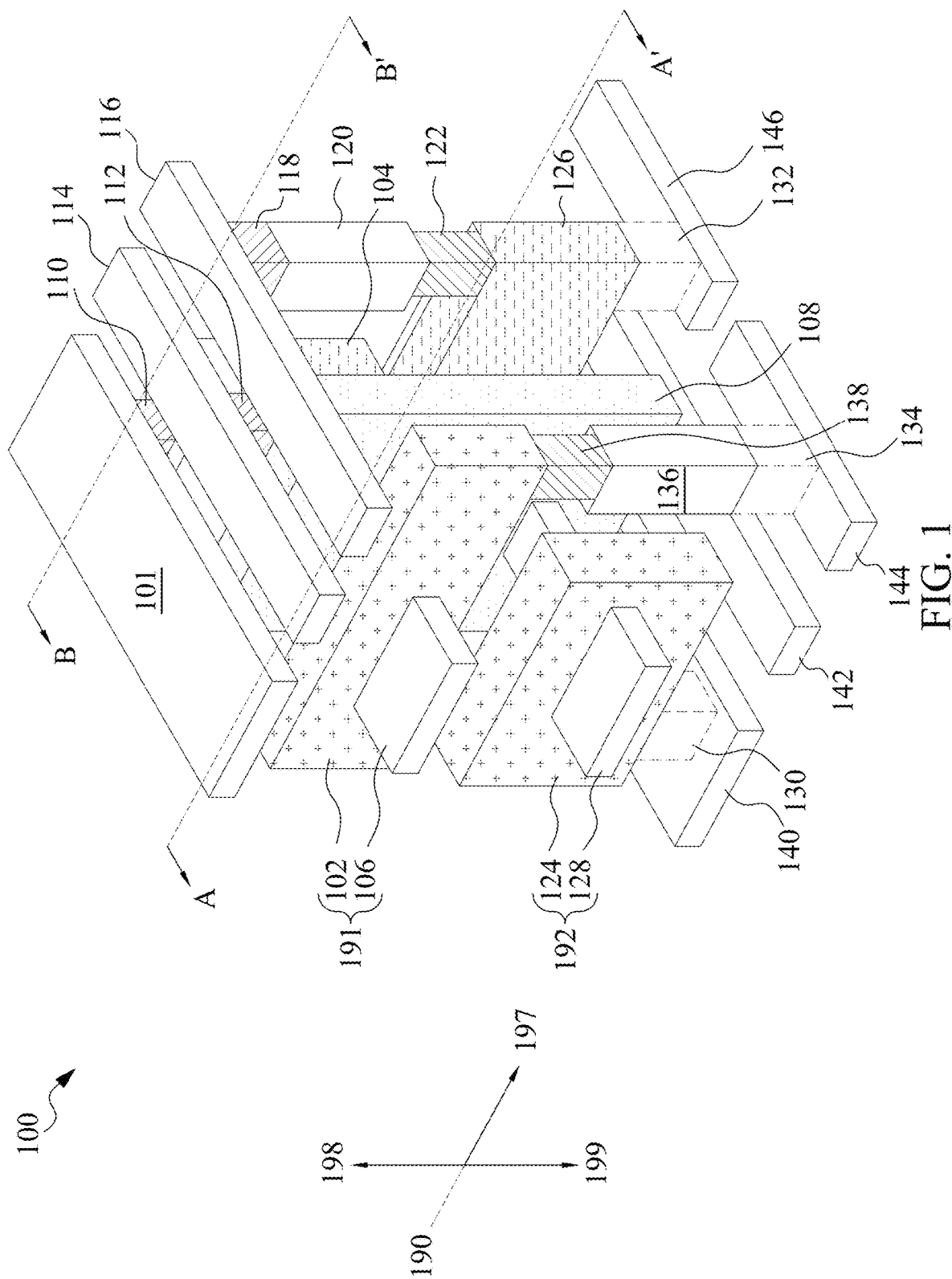
FIG. 1 is a perspective view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reducing a die size of a semiconductor device permits a manufacturer to reduce manufacturing costs and increase profit margins. Reducing die size is frequently accomplished by reducing a lateral area of a transistor in the die. Reducing die size is also frequently accomplished by modifying an interconnect structure of a semiconductor device to position transistors and other circuit elements closer together without wasted space to accommodate the interconnect structure above the circuit elements. A spatially-efficient interconnect structure reduces parasitic capacitance and increases a switching speed of the semiconductor device.

As semiconductor devices shrink from generation to generation, the use of a spatially-efficient interconnect structure becomes a greater influence on die size reduction. Many interconnect structures use high-aspect ratio monolithic vias to extend between conductive lines or other elements of the semiconductor devices in spatially-efficient interconnect structures. The small lateral dimensions of high aspect ratio monolithic vias increases the likelihood that manufacturing defects, such as fill errors (e.g., overfilling a via with a liner material, or formation of voids during metal fill of contacts after liner deposition), will shift transistor performance characteristics beyond a performance specification threshold for the semiconductor device.

The present disclosure describes semiconductor devices with a spatially-efficient interconnect structure feature, a "bridge pillar," which electrically connects circuit elements on either side of a base isolation layer in a semiconductor device. A base isolation layer, in some embodiments, is a layer of dielectric material which separates a first set of circuit elements (e.g., "top" transistors) from a second set of circuit elements (e.g., "bottom" transistors). In some embodiments, the base isolation layer is a layer of silicon dioxide, a low-dielectric constant (low-k) dielectric material, or some other dielectric material which is deposited over a substrate before manufacture of a channel bar or source or drain electrode of a transistor at one side of the base isolation layer. In some embodiments, the dielectric material above the base isolation layer, and which surrounds a transistor (e.g., source/drain electrodes and channel bar) includes silicon dioxide, a low-k dielectric material, or some other dielectric material compatible with a gate-all-around (GAA) transistor manufacturing flow. In some embodiments, transistors on both sides of the base isolation layer are GAA transistors. In some embodiments, the GAA transistors have a source electrode laterally separated from a drain electrode, with a channel bar extending from the source electrode to the drain electrode, and a gate electrode surrounds a circumference of a middle portion of the channel bar. The source electrode and drain electrode are referred to collectively as source/drain (SD) electrodes of the transistor. A gate dielectric separates the middle portion of the channel bar from the gate electrode. The channel of the transistor is located at the middle portion of the channel bar, a source region of the channel bar is at the end of the channel bar which is against the source electrode, and the drain region of the channel bar is at the end of the channel bar which is against the drain electrode. Dielectric material separates the gate electrode from the SD electrodes at either end of the channel bar.

Power and signals for a transistor travel through a semiconductor device in conductive lines and vias or contacts, called an interconnect structure, which extend over the transistors of the device. In some embodiments, the interconnect structure is divided into a top portion and a bottom portion at opposite sides of the base isolation layer in order to reduce die size and allow for more spatially-efficient routing of power and signals to and from the transistors. In a semiconductor device with a first set of transistors on the top side of the base isolation layer, and a second set of transistors the bottom side of the base isolation layer, a divided interconnect structure allows for a higher density of electrical connections per unit cell of the die area to the transistors than is used for semiconductor devices with a single layer of transistors.

A bridge pillar (see, e.g., bridge pillars 122 and 138 of FIG. 1) is an electrical connection which extends through the base isolation layer. In some embodiments, a bridge pillar electrically connects a top transistor source or drain electrode to a bottom transistor source or drain electrode. In some embodiments, a bridge pillar electrically connects a circuit element (e.g., a source electrode or a drain electrode) at one side of the base isolation layer, to a conductive line at the opposite side of the base isolation layer, through a contact and a metal electrode. In some embodiments, a metal electrode (see, e.g., metal electrode 136 of FIG. 1) is a portion of the material used for the source and drain electrodes of a transistor which is laterally separated from the source and drain electrodes at the same side of the base isolation layer and which extends through the dielectric material having the source/drain electrodes therein. A metal electrode provides a vertical connection between a bridge pillar and a via or a contact in the top interconnect structure or in the bottom interconnect structure without having to perform an additional set of steps to manufacture a signal-routing via and without the spatial penalty of additional conductive lines between the transistor and a signal routing via.

A signal routing via is a via or interconnect feature which extends from at least the first layer of conductive lines (e.g., top M0 lines, or TM0 lines) at the top side of the base isolation layer to at least the first layer of conductive lines (e.g., bottom M0 lines, or BM0 lines) at the bottom side of the base isolation layer, and carries a signal or power to or from transistors by means of the conductive lines at opposite sides of the base isolation layer. The benefits of using a segmented interconnect structure (e.g., bridge pillars and metal electrodes) instead of a signal routing via are described below with respect to the description of FIGS. 11A and 11B.

FIG. 1 is a perspective view of a semiconductor device 100 in accordance with some embodiments. In semiconductor device 100, a combination of bridge pillars and Metal contacts electrically connect portions of transistors to conductive lines at an opposite side of a base insulation layer between two transistors. In FIG. 1, dielectric or insulating materials around the components of the transistors and interconnect structure are omitted to clarify the structure of the semiconductor device.

Semiconductor device 100 includes transistor 191 and transistor 192. Transistor 191 includes a source electrode 102, a drain electrode 104, a channel bar 106, and a gate electrode 108 surrounding channel bar 106 where channel bar 106 extends from source electrode 102 to drain electrode 104. Source electrode 102 and drain electrode 104 extend around a circumference of the channel bar 106. Transistor 192 includes source electrode 124, drain electrode 126, channel bar 128, and gate electrode 108 surrounding channel bar 128 where channel bar 128 extends from source electrode 124 to drain electrode 126. Source electrode 124 and drain electrode 126 extend around a circumference of channel bar 128. Gate electrode 108 extends around a circumference of channel bar 106 and around a circumference of channel bar 128 at a middle portion of the channel bar 106 and the middle portion of channel bar 128.

In some embodiments, source electrodes 102 and 124 and drain electrodes 104 and 126, collectively called source and drain electrodes, of transistors 191 and 192 are manufactured by diffusion or sputtering from a metal target into an opening in a layer of dielectric material. In some embodiments, the source and drain electrodes are manufactured from cobalt (Co), tungsten (W), copper (Cu), ruthenium (Ru), titanium (Ti), tantalum (Ta), or alloys thereof, or other conductive materials which are suitable for diffusion or sputtering into openings to form a source or drain electrode.

A channel bar, e.g., channel bar 106 or channel bar 128, in a transistor as described herein is semiconductor material which extends from a source electrode to a drain electrode and optionally has dopants added thereto to adjust the electrical or switching properties of the transistor. In some embodiments, the dopants added to a channel bar include low-density doped (LDD) regions which extend under a gate dielectric material. In some embodiments, the channel bar is a single portion of semiconductor material with a gate dielectric extending around circumference of a middle portion of the channel bar between the source electrode and the drain electrode. In some embodiments, the channel bar includes multiple portions of semiconductor material aligned in parallel with each other extending from the source electrode to the drain electrode. In some embodiments, the channel bar is manufactured using silicon, silicon germanium (SiGe), gallium arsenide (GaAs), or some other semiconductor material which is suitable for a GAA-type transistor. In some embodiments, a channel bar is manufactured by the depositing alternating layers of a dielectric material and semiconductor material, performing an etch process to trim the layers into an isolated portion extending from the source electrode to the drain electrode, and etching the dielectric material of the isolated portion to expose the circumference of each portion of semiconductor material at a middle portion of the channel bar before forming a gate dielectric material on the middle portion of the channel bar, and depositing the gate electrode over the middle portion of the channel bar.

In some embodiments, the gate dielectric material includes silicon dioxide. In some embodiments, the gate dielectric material includes a high-k dielectric material such as ruthenium oxide (RuO) or hafnium oxide (HfO), although other high-k dielectric materials are also within the scope of the present disclosure. In some embodiments, the gate dielectric material is formed by thermal oxidation. In some embodiments, the gate dielectric material is formed by deposition, such as atomic layer deposition (ALD).

A reference line 190 extends laterally through a base isolation layer (not shown). In the present disclosure, the term "top transistor" is used to refer to a transistor in a first direction 198 from a reference line 190 (e.g., transistor 191), and the term "bottom transistor" is used to refer to the transistor in the second direction 199 from the reference line 190 (e.g., transistor 192). In semiconductor device 100, transistor 191 is the top transistor and transistor 192 is the bottom transistor.

Reference line 190 extends laterally through bridge pillar 122 and bridge pillar 138, and through gate electrode 108. In some embodiments, the reference line extends between two separate gate electrodes, one for the top transistor, and one for the bottom transistor, that are immediately adjacent to the same portion of the base isolation layer.

A power rail 101 extends over transistor 191 parallel to conductive line 114 and conductive line 116. Power rail 101 electrically connects to a drain electrode 104 of transistor 191 by a contact 110. A power rail 140 extends parallel to power rail 101 below transistor 192, and parallel to conductive lines 142, 144, and 146. Gate electrode 108 electrically connects to conductive line 114 by gate electrode contact 112.

In semiconductor device 100, bridge pillars 122 and 138 cross the reference line 190 and extend through the base isolation layer (not shown). In semiconductor device 100, bridge pillar 138 is laterally separated from the channel bar 106 of transistor 192 along in the third direction 197.

Source electrode 124 is electrically connected to a power rail 140 by a contact 130. Power rail 140 extends parallel to power rail 101 above transistor 191, and conductive lines 142, 144, and 146 extend parallel to power rail 140. Conductive line 144 electrically connects to contact 134. Bridge pillar 138 is electrically connected to conductive line 144 by contact 134 and a metal electrode 136. Metal electrode 136 is vertically aligned with bridge pillar 138 and contact 134.

In some embodiments, a bridge pillar is manufactured by performing an etch process on the base isolation layer to form an opening entirely therethrough; depositing a liner on the sidewalls of the opening; and depositing a bridge pillar fill material into the opening over the liner on the sidewalls of the opening. In some embodiments, the liner also covers the bottom of the opening and is preserved when manufacturing transistors on both sides of the base isolation layer. In some embodiments, the liner material and/or the bridge pillar fill material serves as endpoint indicators when manufacturing transistors at an opposite side of the base isolation layer from a pre-existing transistor of the semiconductor device. In some embodiments, the bridge pillar liner and the bridge pillar fill materials are the same as the materials used in a source electrode or drain electrode of a transistor of the semiconductor device. In some embodiments, the bridge pillar liner and bridge pillar fill materials are different from the materials used a source electrode or drain electrode of a transistor.

In some embodiments, metal electrodes are manufactured by performing an etch process on a layer of dielectric material directly against, or separated from, the base isolation layer, to expose an end of at least one bridge pillar portion extending through the base isolation layer. In some embodiments, metal electrodes are manufactured by depositing a liner on a sidewall of the opening through the layer of dielectric material and on an exposed end of the bridge pillar In transistor 192, drain electrode 126 electrically connects to conductive line 146 by a contact 132, and electrically connects to conductive line 116 by bridge pillar 122, contact 118, and metal electrode 120. Metal electrode 120 is vertically aligned with bridge pillar 122 and contact 118 along the first direction 198. Metal contact 120 and bridge pillar 122 provide for a no-lateral distance electrical connection between drain electrode 126 and conductive line 116 at opposite sides of the base isolation layer (e.g., the metal electrode 120, the bridge pillar 122, the contact 118 and a portion of the drain electrode 126 are vertically aligned). Metal electrode 136 and bridge pillar 138 provide for a no-lateral distance electrical connection between source electrode 102 and conductive line 144 at opposite sides of the base isolation layer.

Figure 2:
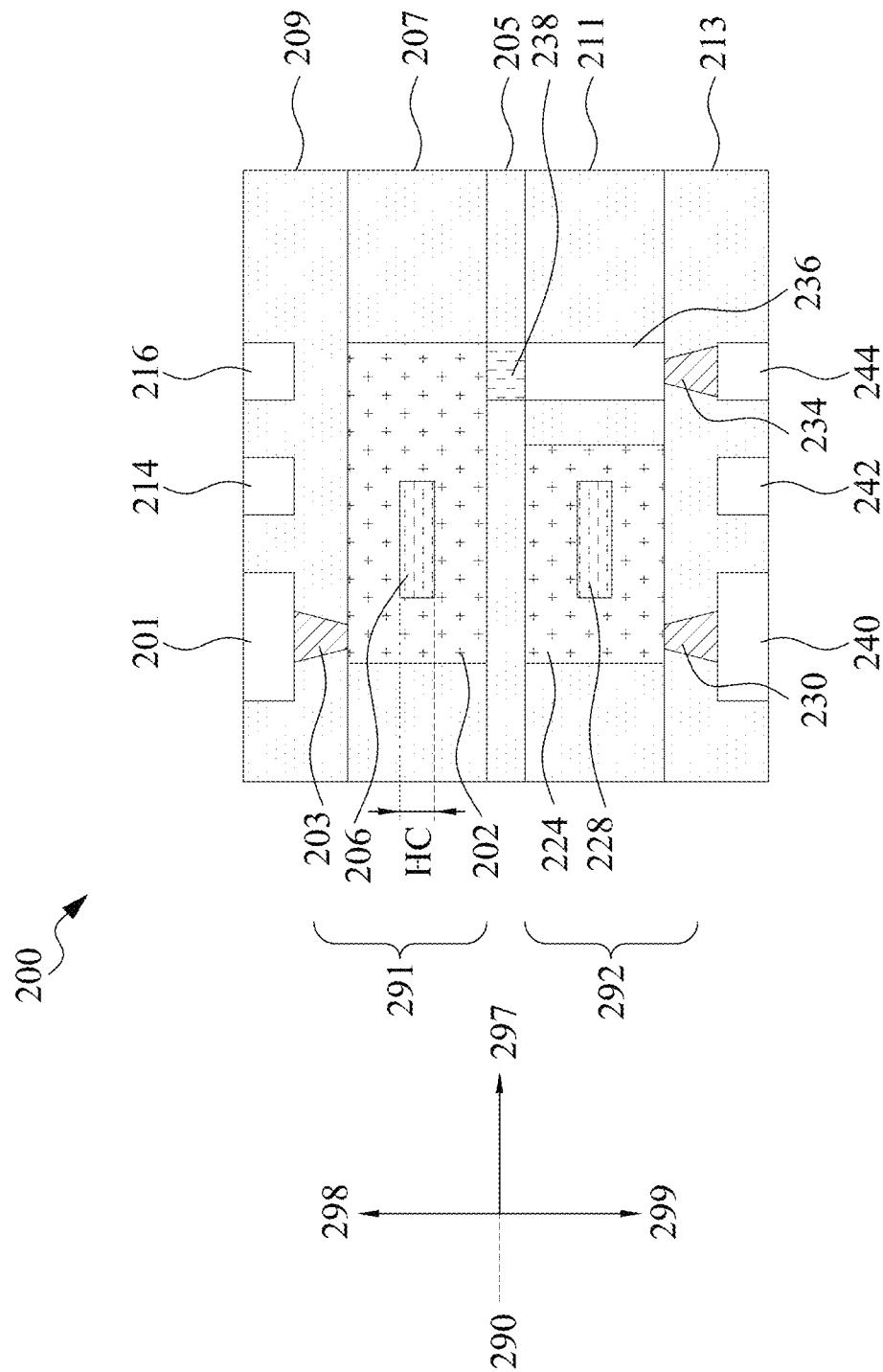
FIG. 2 is a cross-sectional view of a semiconductor device in accordance with some embodiments.

FIG. 2 is a cross-sectional view of a semiconductor device 200 in accordance with some embodiments. The cross-sectional view of semiconductor device 200 corresponds to a cross-sectional view along cross-sectional line A-A' of semiconductor device 100 of FIG. 1, described above. Elements of semiconductor device 200 which have a same structure or function as a corresponding element of semiconductor device 100 in FIG. 1 have a same identifying numeral, incremented by 100. In semiconductor device 200, a source electrode at a "top" of the semiconductor device electrically connects to a conductive line at the opposite side of a base isolation layer 205 with a bridge pillar 238 and metal electrode 236. Isolation layers are included in FIG. 2 despite being omitted in FIG. 1 for clarity.

In semiconductor device 200, base isolation layer 205 extends along a reference line 290 extending along a second direction 297 between transistor 291 and transistor 292. Transistor 291 above the base isolation layer 205 in a first direction 298 from reference line 290, and transistor 292 is below base isolation layer 205 in a second direction 299 from reference line 290. Power rail 201 extends over transistor 291, and power rail 240 extends below transistor 292. Transistor 291 is located in a layer of dielectric material 207, and transistor 292 is located in a layer of dielectric material 211. Transistor 291 includes source electrode 202 and channel bar 206. Transistor 292 includes source electrode 224 and channel bar 228. Source electrode 202 extends around a circumference of channel bar 206. Channel bar 206 has a channel height (HC) in the first direction 298 from the reference line 290. The channel height HC is the height or thickness of the channel bar (or, for a transistor with multiple channels, the largest measurement along the first direction 298). Source electrode 224 extends around a circumference of channel bar 228. Power rail 201, contact 203, and conductive lines 214 and 216 are located in a layer of dielectric material 209. Power rail 240, conductive lines 242 and 244, and contacts 230 and 234 are located in dielectric material 213.

Bridge pillar 238 extends through base isolation layer 205 and electrically connects source electrode 202 of transistor 291 to metal electrode 236. Metal electrode 236 extends through dielectric material 211 and electrically connects bridge pillar 238 to contact 234. Contact 234 is electrically connected to conductive line 244. Contact 230 electrically connects source electrode 224 to power rail 240.

In semiconductor device 200, the electrical connection between source electrode 202 and conductive line 244 (e.g., a "bridging connection" which extends through bridge pillar 238, metal electrode 236, and contact 234) makes the semiconductor device more compact than semiconductor devices which do not use "bridging connections" or "bypass connections" as described herein, and reduces the extent to which bottom M1 lines (e.g., conductive lines below dielectric material 213 and conductive lines 242 and 244) are used to route signals within semiconductor device 200.

Figure 3:
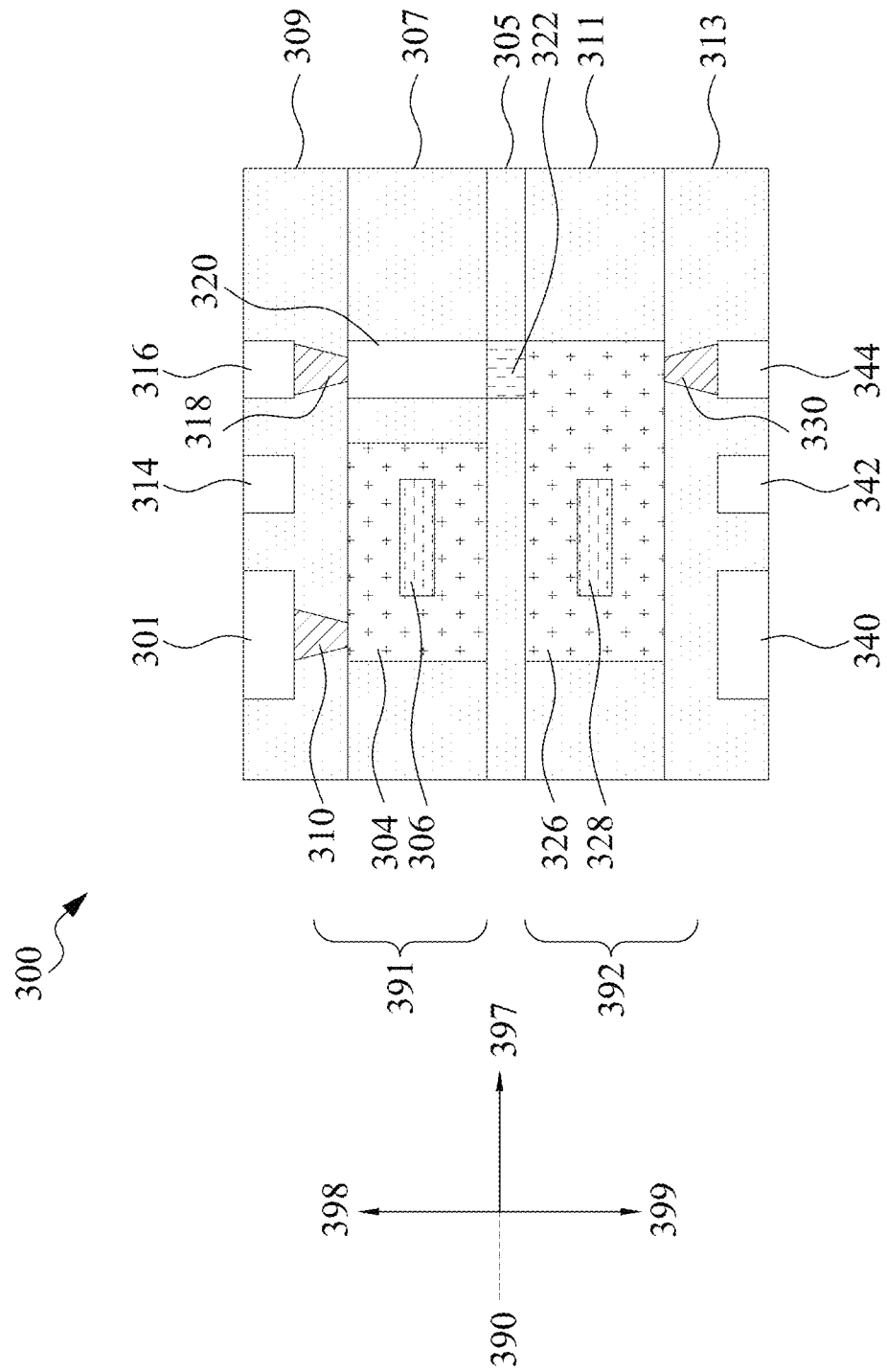
FIG. 3 is a cross-sectional view of a semiconductor device in accordance with some embodiments.

FIG. 3 is a cross-sectional view of a semiconductor device 300 in accordance with some embodiments. The cross-sectional view of semiconductor device 300 corresponds to a cross-sectional view along cross-sectional line B-B' of FIG. 1, described above. Elements of semiconductor device 300 which have a same structure or function as a corresponding element of semiconductor device 100 in FIG. 1 have a same identifying numeral, incremented by 200. In semiconductor device 300, drain electrode 326 electrically connects with conductive line 316 at an opposite side of base isolation layer 305 through bridge pillar 322, metal electrode 320, and contact 318.

In semiconductor device 300, transistor 391 includes drain electrode 304 and channel bar 306. Transistor 392 includes drain electrode 326 and channel bar 328. Drain electrode 304 extends around a circumference of channel bar 306. Drain electrode 326 extends around a circumference of channel bar 328.

Base isolation layer 305 is between transistor 391 and transistor 392. Transistor 391 is in dielectric material 307, and transistor 302 is in dielectric material 311. Power rail 301 and conductive lines 314 and 316 are in dielectric material 309. Contact 310 extends through a portion of dielectric material 309 to electrically connect power rail 301 to drain electrode 304. Contact 318 extends through a portion of dielectric material 309 to electrically connect conductive line 316 to metal electrode 320 in dielectric material 307. Conductive lines 314 and 316 are top M0 lines of the semiconductor device 300.

Metal electrode 320 extends through dielectric material 307 and electrically connects contact 318 to bridge pillar 322. Bridge pillar 322 extends through base isolation layer 305 and electrically connects metal electrode 320 to drain electrode 326.

Power rail 340 and conductive lines 342 and 344 are in dielectric material 313. Contact 330 extends through a portion of dielectric material 313 to electrically connect conductive line 344 to drain electrode 326. Conductive lines 342 and 344 are bottom M0 lines in semiconductor device 300.

In semiconductor device 300, the electrical connection between drain electrode 326 and conductive line 316 (e.g., a "bridging connection" which extends through bridge pillar 322, metal electrode 320, and contact 318) makes the semiconductor device more compact, and reduces the extent to which M1 lines (e.g., conductive lines above dielectric material 309 and conductive lines 314 and 316) are used to route signals within semiconductor device 300.

Figure 4:
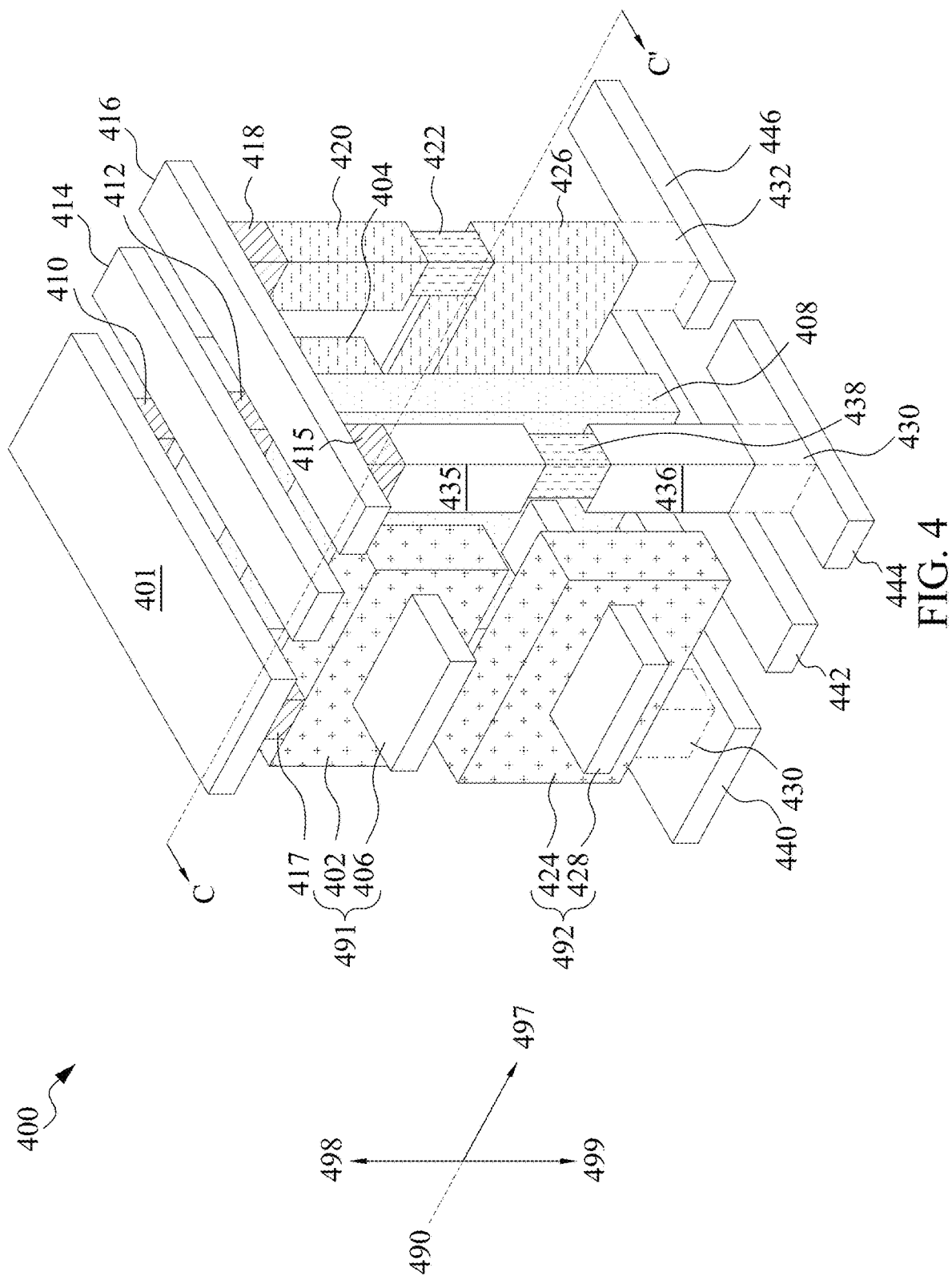
FIG. 4 is a perspective view of a semiconductor device in accordance with some embodiments.

FIG. 4 is a perspective view of a semiconductor device 400 in accordance with some embodiments. Elements of semiconductor device 400 which have a same structure and/or function as elements of semiconductor device 100 have a same identifying numeral, incremented by 300. A cross-sectional line C-C' extends through the source electrode 402 of transistor 491, and through the source electrode 424 of transistor 492. Transistor 491 and transistor 492 are at opposite sides of a base isolation layer (not shown). Reference line 490 extends through base isolation layer between transistors 491 and 492.

In semiconductor device 400, a first conductive line (conductive line 416) is electrically connected to a second conductive line (conductive line 444), bypassing the transistors 491 and 492. This bypass connection (one type of segmented interconnect structure) has an electrical path extending from conductive line 416, through contact 415, metal electrode 435, bridge pillar 438, metal electrode 436, and contact 430, down to conductive line 444. The elements of the bypass connection are substantially vertically aligned. In some embodiments, the elements of the bypass connection have portions which are vertically aligned, and portions which are laterally offset from each other.

Semiconductor device 400 also includes a bridging connection between drain 426 of transistor 492 to the conductive line 416 above transistor 491 (e.g., the bridging connection runs through contact 418, metal electrode 420, and bridge pillar 422).

Figure 5:
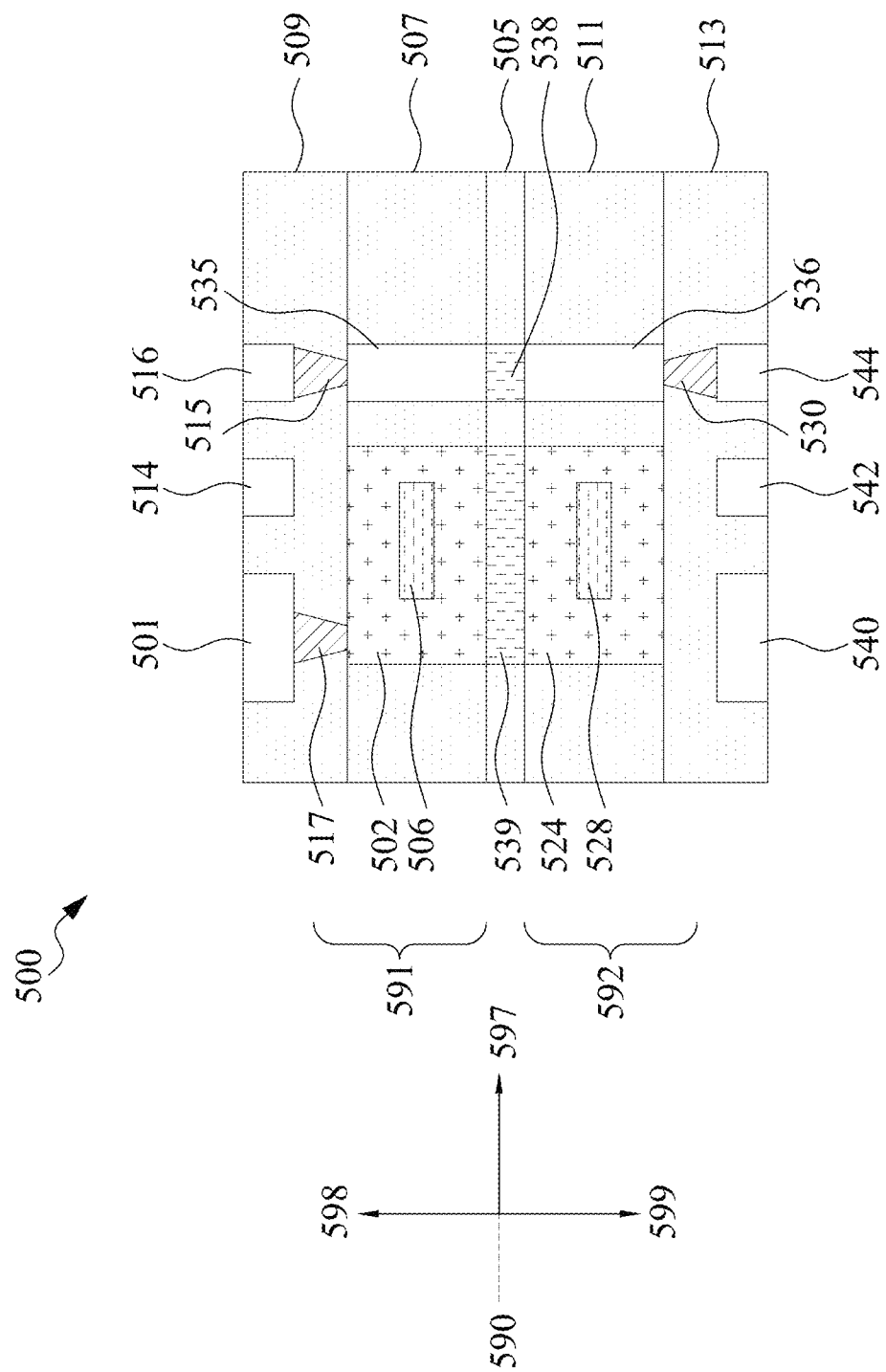
FIG. 5 is a cross-sectional view of a semiconductor device in accordance with some embodiments.

FIG. 5 is a cross-sectional view of a semiconductor device 500 in accordance with some embodiments. The cross-sectional view of semiconductor device 500 corresponds to a cross-sectional view along cross-sectional line C-C' of FIG. 4, described above. Elements of semiconductor device 500 which have a same structure or function as a corresponding element of semiconductor device 400 have a same identifying numeral, 100.

In semiconductor device 500, base isolation layer 505 extends between transistor 591 in dielectric material 507, and between transistor 592 in dielectric material 511. Bridge pillar 538 extends through base isolation layer 505 and electrically connects metal electrode 535 in dielectric material 507 to metal electrode 536 in dielectric material 511. Bridge pillar 539 in base isolation layer 505 electrically connects source 502 of transistor 591 to source 524 of transistor 592. A bridge pillar which electrically connects two sources of two transistors at opposite sides of a base isolation layer is also able to perform the function of a bridge connection or a bypass connection as described above for semiconductor device 400. Source 502 surrounds a circumference of channel bar 506. Source 524 surrounds a circumference of channel bar 528.

Bridge pillar 538 and bridge pillar 539 are manufactured in a manner analogous to the method described above for bridge pillar 138 in semiconductor device 100, or as described in Method 1000 below. Metal electrodes 535 and 536 are manufactured in a manner analogous to the method described above for bridge pillar 138 in semiconductor device 100, or described in Method 1000 below. In some embodiments, bridge pillars and metal electrodes are manufactured by depositing a liner (bridge pillar liner or metal electrode liner) into an opening through a base isolation layer or dielectric material, and depositing a fill material (bridge pillar fill material or metal electrode fill material) into the opening over the liner.

In semiconductor device 500, power rail 501 is located in dielectric material 509 and electrically connects to source 502 of transistor 591 by a contact 517. Contact 515 electrically connects conductive line 516 to metal electrode 535. Conductive lines 514 and 516 are also located in dielectric material 509. Power rail 540 and conductive lines 542 are located in dielectric material 513. Contact 530 electrically connects conductive line 544 to metal electrode 536.

Figure 6:
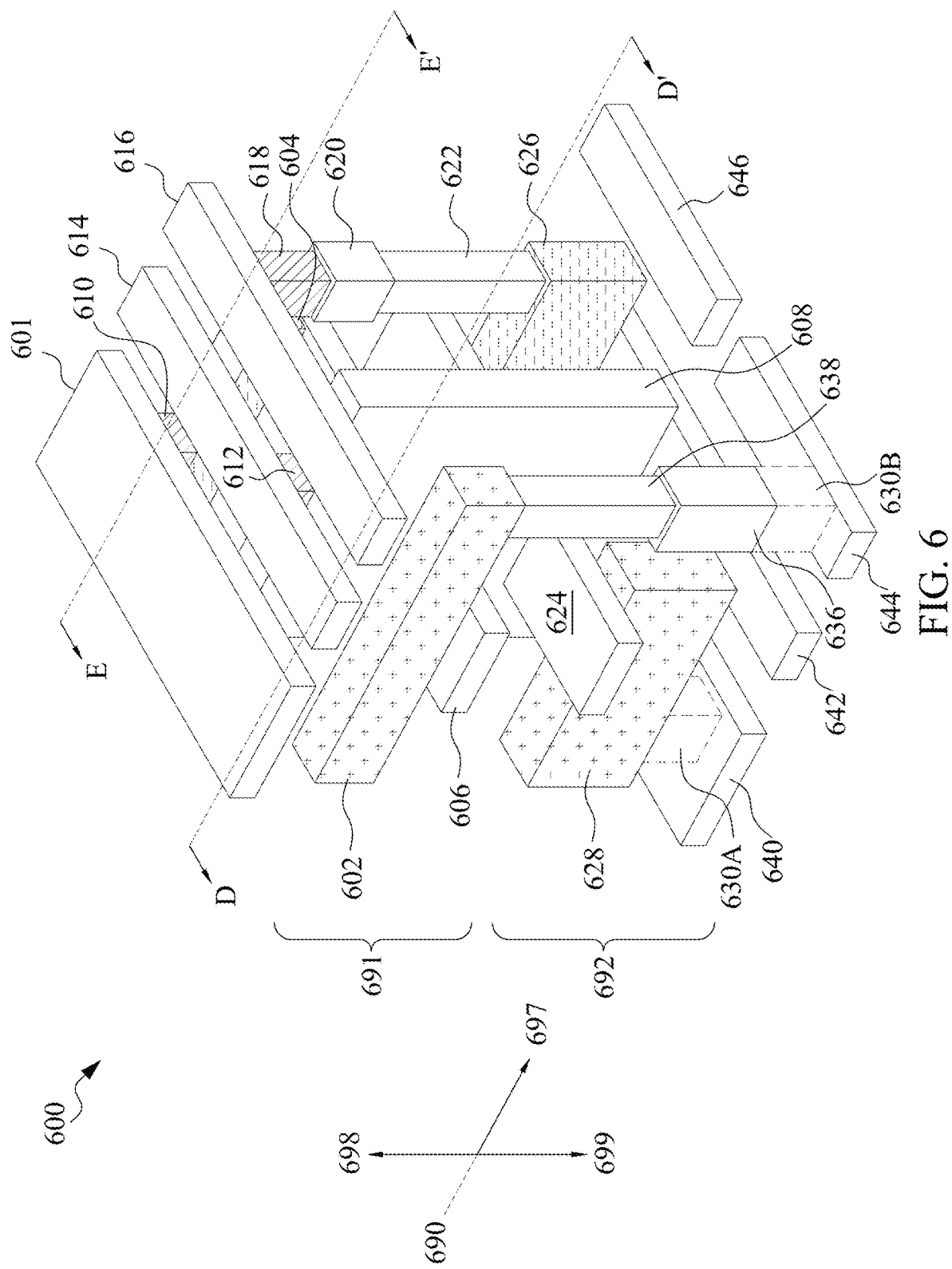
FIG. 6 is a perspective view of a semiconductor device in accordance with some embodiments.

FIG. 6 is a perspective view of a semiconductor device 600 in accordance with some embodiments. Elements of semiconductor device 600 which have a same structure or function as elements of semiconductor device 100 have a same identifying numeral, incremented by 500.

In semiconductor device 600, the base isolation layer and dielectric materials around and between the transistors have been omitted for clarity. Reference line 690 extends between transistor 691 and transistor 692 of semiconductor device 600. In semiconductor device 600, the source electrodes do not surround a full circumference of the channel bars, but are against part of the circumference (e.g., against one side, the side closest to the reference line 690. A first segmented interconnect structure (e.g., a variant of the bypass connection described above) electrically connects the source electrode 602 of transistor 691 to conductive line 644, and a second segmented interconnect structure electrically connects drain electrode 626 of transistor 692 to conductive line 616, as described below.

Power rail 601 extends over transistor 691 and in parallel to conductive lines 614 and 616. Power rail 640 extends below transistor 691 and in parallel to conductive lines 642, 644, and 646. Contact 630A electrically connects power rail 640 to source electrode 628 of transistor 692. Contact 630B electrically connects conductive line 644 to metal electrode 636. metal electrode 636 is laterally separated from source electrode 628 in the third direction 697. Source electrode 628 is against a bottom side of channel bar 624. Channel bar extends parallel to power rail 640 and perpendicular to source electrode 628 to drain electrode 626. Channel bar is against one side of drain electrode 626. Gate electrode 608 extends around a middle portion of channel bar 624 between source electrode 628 and drain electrode 626.

In transistor 691, source electrode 602 extends perpendicular to channel bar 606, and is against one side of channel bar 606. Channel bar 606 extends to drain electrode 604 and is against one side of drain electrode 604. Gate electrode 608 extends around a middle portion of channel bar 606 between source electrode 602 and drain electrode 604.

Source electrode 602 is electrically connected to conductive line 644 by a bridge connection which includes bridge pillar 638, metal electrode 634, and contact 630B. Bridge pillar is directly against the side of source electrode 602, and the end of the bridge pillar proximal to source electrode 602 is approximately the same distance from reference line 690 as the side of the channel bar farthest from reference line 690. In semiconductor device 600, the channel bar 606 is located in a layer of dielectric material which surrounds the sides of the bridge pillar proximal to the source electrode 602. An end of the bridge pillar proximal to the metal electrode 636 is laterally surrounded by a same dielectric material which is against the sides of the channel bar 624 of transistor 692.

In semiconductor device 600, a bypass connection which includes contact 618, metal electrode 620, and bridge pillar 622 electrically connects drain electrode 626 of transistor 692 to conductive line 616 at the opposite side of reference line 690. Bypass connections as described in semiconductor device 600 are used to increase the compactness of a semiconductor device and reduce the amount of M0, or M1, wiring used to route signals and/or power around the semiconductor device. Cross-sectional line D-D' extends through source electrodes 602 and 628. Cross-sectional line E-E' extends through drain electrodes 604 and 626.

Figure 7:
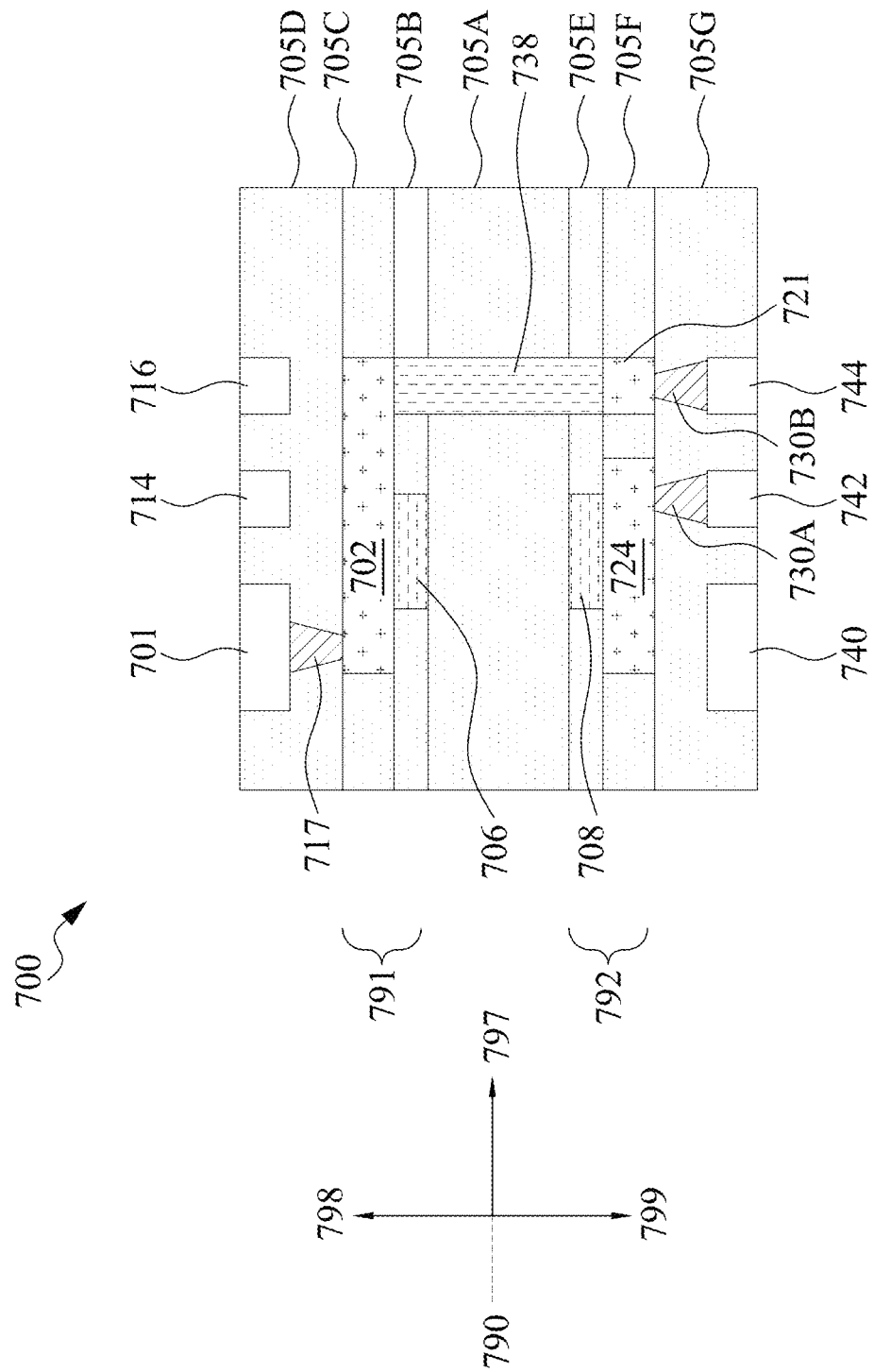
FIG. 7 is a cross-sectional view of a semiconductor device in accordance with some embodiments.

FIG. 7 is a cross-sectional view of a semiconductor device 700 in accordance with some embodiments. FIG. 7 is a cross sectional view of a semiconductor device which is similar to the cross sectional view along cross-sectional line D-D'. Elements of semiconductor device 700 which have a same structure or function as a corresponding element of semiconductor device 600 of FIG. 6 have a same identifying reference, incremented by 100. In semiconductor device 700, a bypass connection between a source electrode and a conductive line at the opposite side of the base isolation layer is used with a source electrode which is against one side of a channel bar.

Semiconductor device 700 includes a base isolation layer 705A between transistor 791 and transistor 792. A reference line 790 extends through base isolation layer 705A and through bridge pillar 738. Dielectric material 705B is against a top surface of base isolation layer 705A, and dielectric material 705E is against a bottom surface of base isolation layer 705A. Bridge pillar extends through an entirety of base isolation layer 705A, and through an entirety of dielectric material 705B and dielectric material 705E. In some embodiments, the base isolation layer between transistors extends the full length of a bridge pillar, and the channel bars (see channel bars 706 and 708) are formed by etching into the base isolation layer. In such an embodiment, the gate dielectric (not shown) between a gate electrode (not shown) at a middle portion of a channel bar is formed in a manner similar to the other embodiments described herein, where the gate dielectric extends around a circumference of each portion of semiconductor material at the middle portion of the channel bar.

Source electrode 702 is against a top side of the channel bar 706 and is located in dielectric material 705C. A bottom side of source electrode 702 is electrically connected to bridge pillar 738.

Source electrode 724 is against a bottom side of channel bar 708 and is laterally separated in the third direction 797 from metal electrode 721, which is also located in dielectric material 705F. Dielectric material 705F is against a bottom side of dielectric material 705E. Metal electrode 721 electrically connects to source electrode 702 bridge pillar 738.

Power rail 701 and conductive lines 714 and 716 are in dielectric material 705D. Dielectric material 705D is over dielectric material 705C and against a top side of source electrode 702. Contact 717 electrically connects power rail 701 to source electrode 702.

Power rail 740 and conductive lines 742 and 744 are in dielectric material 705G. Dielectric material 705G is below dielectric material 705F. Contact 730A electrically connects conductive line 742 to source electrode 724. Contact 730B electrically connects conductive line 744 to metal electrode 721.

The bypass connection between source electrode 702 and conductive line 744 includes bridge pillar 738, metal electrode 721, and contact 730B. Bypass connections of the type described for semiconductor device 700 increase circuit density for semiconductor devices and reduce the amount of space which is used for conductive lines in an interconnect structure. By reducing the space used for conductive lines, manufacturing costs for a device are reduced and patterning mask complexity for interconnect structures (especially at the M0 and M1 levels of a semiconductor device) is reduced, reducing patterning issues and increasing lithography process window.

Figure 8:
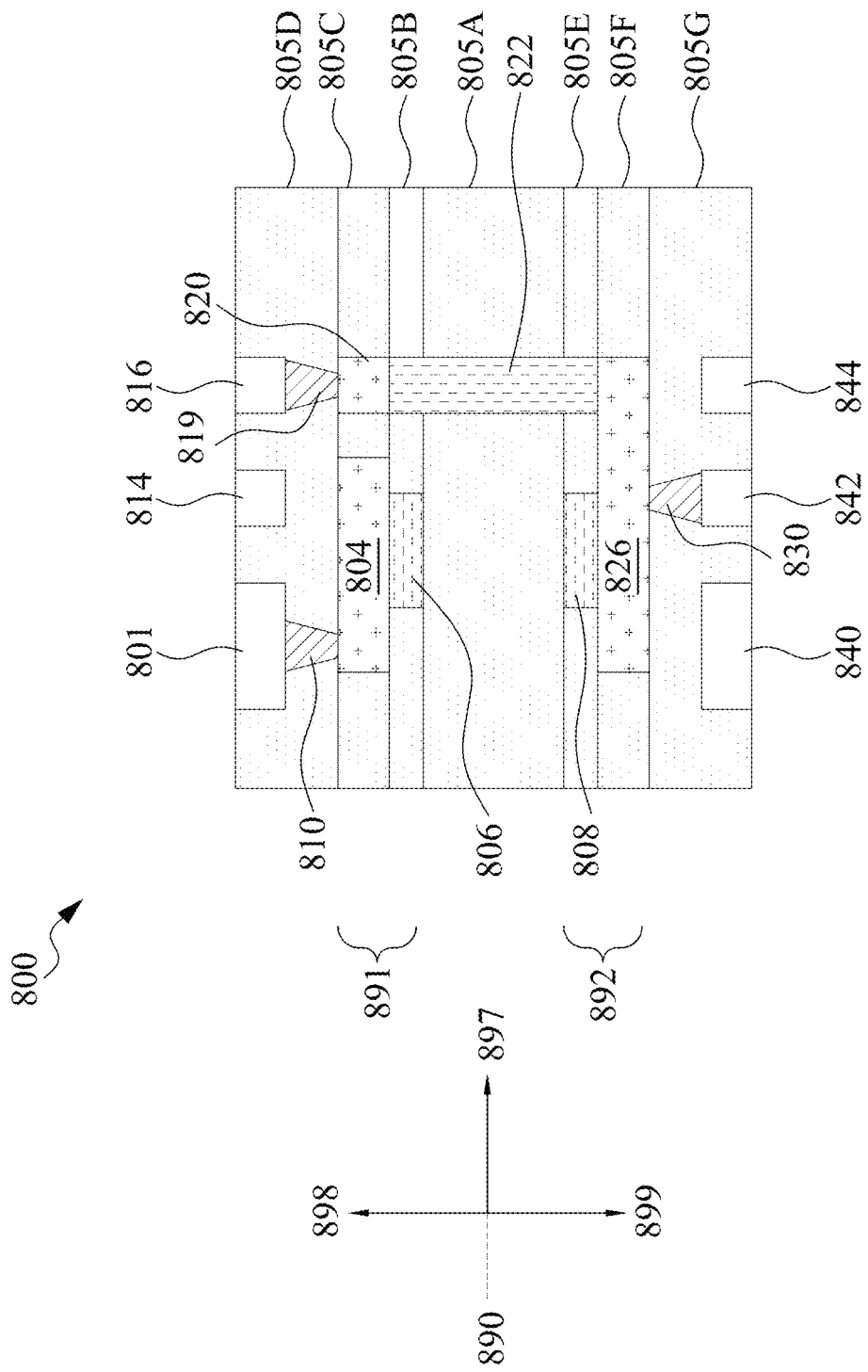
FIG. 8 is a cross-sectional view of a semiconductor device in accordance with some embodiments.

FIG. 8 is a cross-sectional view of a semiconductor device 800 in accordance with some embodiments. FIG. 8 is a cross sectional view of a semiconductor device which is similar to the cross sectional view along cross-sectional line E-E'. Elements of semiconductor device 800 which have a same structure or function as a corresponding element of semiconductor device 600 of FIG. 6 have a same identifying reference, incremented by 200. In semiconductor device 800, a bypass connection is between a source electrode 824 and a conductive line 816 at the opposite side of the base isolation layer 805A. Source electrode 824 is against one side of a channel bar 808 (e.g., less than the whole circumference of the channel bar 808).

Contact 810, contact 819, power rail 801, and conductive lines 814 and 816 are located in dielectric material 805D in a first direction 898 from reference line 890. Power rail 801 electrically connects to source electrode 802 in dielectric material 805C by a contact 810. Reference line 890 extends between transistor 891 and transistor 892. Conductive line 816 electrically connects to contact 819.

Power rail 840, contact 830, and conductive lines 842 and 844 are located in dielectric material 805G below reference line 890. Contact 830 electrically connects conductive line 842 to source electrode 824 in dielectric material 805F.

In semiconductor device 800, drain electrode 804 of transistor 891 is a "half-height" drain electrode, which is against one side of the channel bar 806. In some embodiments, the drain electrode 804 is also against a portion of the sides of the channel bar. Similarly, drain electrode 826 of transistor 892 is against one side of channel bar 808, rather than extending around a circumference of channel bar 808.

The bypass connection of semiconductor device 800 electrically connects drain electrode 826 in the second direction 899 from reference line 890 to the conductive line 816 at the first direction 898 from reference line 890. The bypass connection includes contact 819, metal electrode 820, and bridge pillar 822. As with semiconductor device 700, bridge pillar 822 extends through an entirety of the base isolation layer 805A, and through dielectric material 805B and dielectric material 805E. Channel bar 806 is located in dielectric material 805B, and channel bar 808 is located in dielectric material 805E. In some embodiments, base isolation layer extends along the entire sidewall of the bridge pillar, and the channel bars are located in a recess in the base isolation layer. The interface between metal electrode 820 and bridge pillar 822 is flush with the interface between drain electrode 804 and channel bar 806 (e.g., both interfaces are at the bottom side of dielectric material 805C). In semiconductor device 800, drain electrode 826 electrically connects to conductive line 842 by a contact 830.

Figure 9:
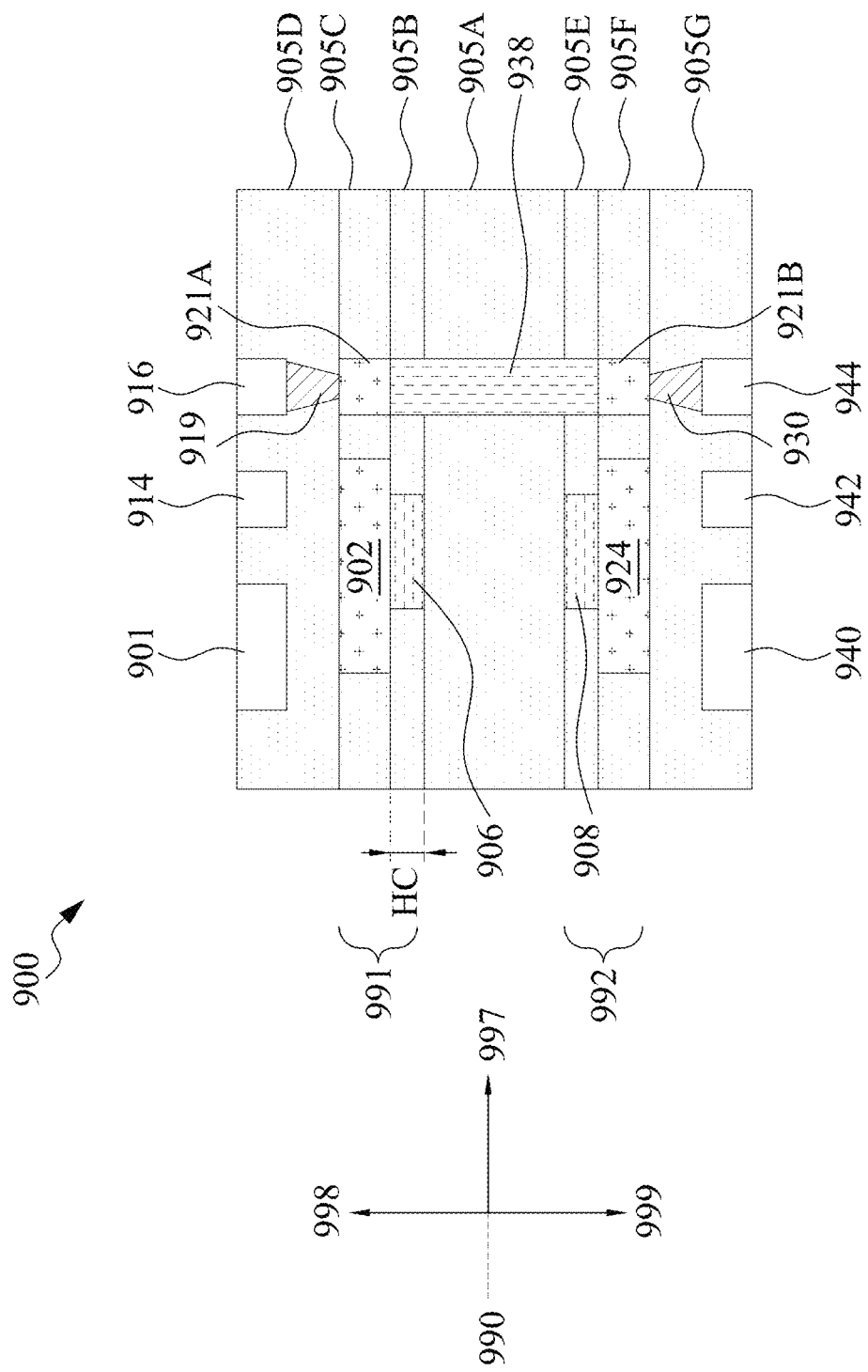
FIG. 9 is a cross-sectional view of a semiconductor device in accordance with some embodiments.

FIG. 9 is a cross-sectional view of a semiconductor device 900 in accordance with some embodiments. FIG. 9 is a cross sectional view of a semiconductor device which is similar to the cross sectional view along cross-sectional line D-D'. Elements of semiconductor device 900 which have a same structure and/or function as semiconductor device 700 have a same identifying numeral, incremented by 200.

In semiconductor device 900, a bypass connection extends from conductive line 916 in the first direction 998 from reference line 990 to conductive line 944 in the second direction 999 from reference line 990, bypassing both transistor 991 and transistor 992. Reference line 990 extends through base isolation layer 905A between transistor 991 and transistor 992. Channel bar 906 is located in dielectric material 905B above base isolation layer 905A, and channel bar 908 is located in dielectric material 905E below base isolation layer 905A.

Bridge pillar 938 extends through base isolation layer 905A, dielectric material 905B, and dielectric material 905E. Bridge pillar electrically connects metal electrode 921A to metal electrode 921B.

Source electrode 902 and metal electrode 921A are located in dielectric material 905C above dielectric material 905B, and source electrode 924 and metal electrode 921B are located in dielectric material 905F below dielectric material 905E. Power rail 901 and conductive lines 914 and 916 are located in dielectric material 905D above dielectric material 905C, and contact 919 electrically connects conductive line 916 to metal electrode 921A. Power rail 940 and conductive lines 942 and 944 are located in dielectric material 905G below dielectric material 905F, and contact 930 electrically connects conductive line 944 to metal electrode 921B.

The bypass connection of semiconductor device 900 electrically connects conductive line 916 in dielectric material 905D to conductive line 944 in dielectric material 905G, and includes contact 919, metal electrode 921A, bridge pillar 938, metal electrode 921B, and contact 930.

Figure 10:
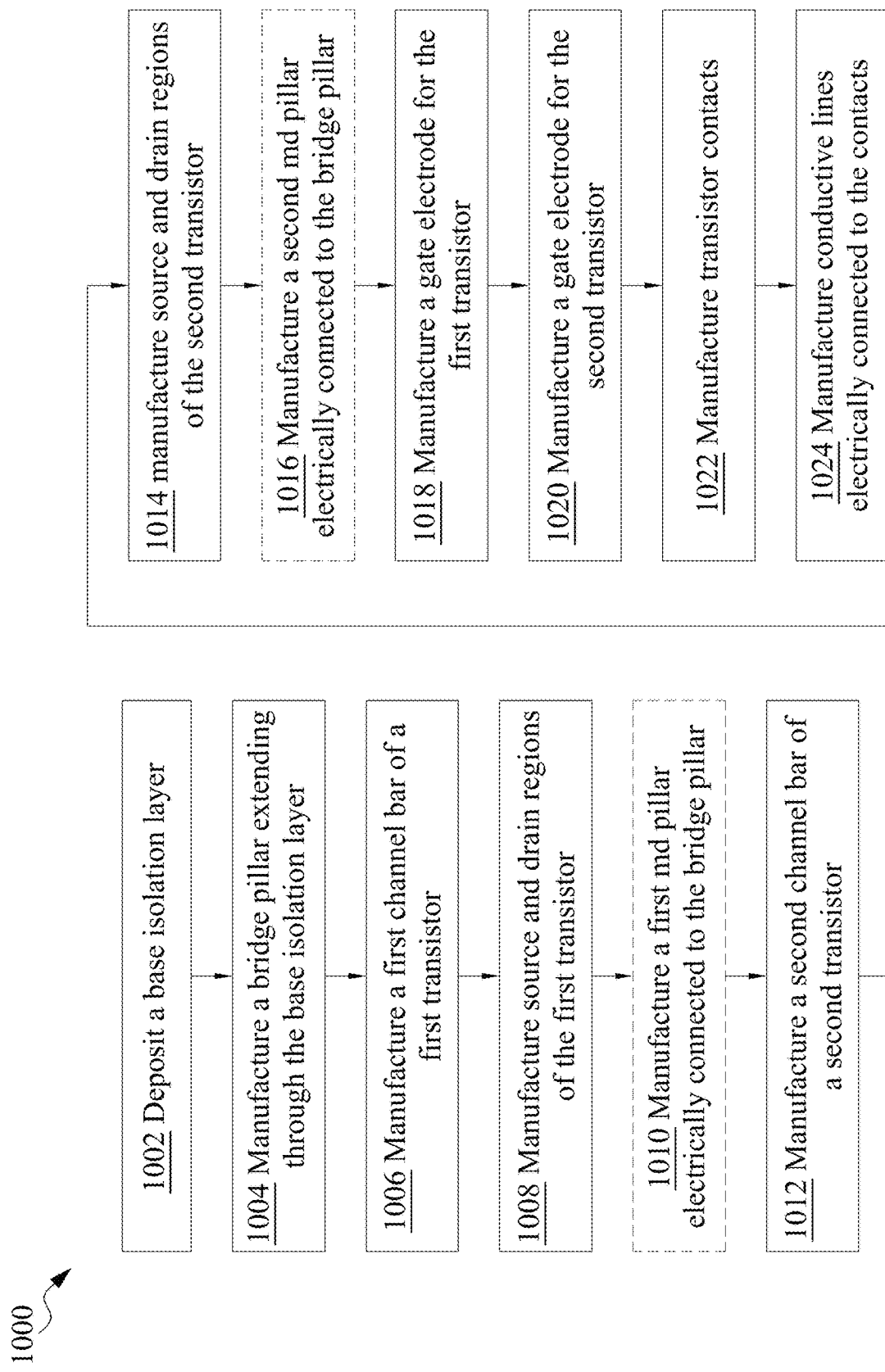
FIG. 10 is a flow diagram of a method of making a semiconductor device in accordance with some embodiments.

FIG. 10 is a flow diagram of a method 1000 of making a semiconductor device in accordance with some embodiments. According to some embodiments of the present disclosure, the method 1000 is adaptable as follows: [1] to make semiconductor devices which include a bridge connection from an SD electrode at one side of base isolation layer to an SD electrode at the opposite side of the base isolation layer (see, e.g., semiconductor device 500), a bridge connection from an SD electrode at one side of the base isolation layer to a conductive line at the opposite side of the base isolation layer (see, e.g., semiconductor devices 200-400 and 600-800, and/or a bypass connection between a conductive line at one side of the base isolation layer to a conductive line at the opposite side of the base isolation layer (see, e.g., semiconductor devices 500 and 900). Other adaptations of method 1000 are also within the scope of the present disclosure to manufacture other configurations of semiconductor devices according to various patterning templates which are used to modify shapes and/or positions of bridge pillars, metal electrode, and/or contacts of the semiconductor devices.

An aspect of the semiconductor devices described herein is that bridge connections described herein are within the perimeter or footprint of a transistor active area of the semiconductor device (e.g., a SD electrode is extended laterally to a position which electrically connects the SD electrode to a bridge pillar extending through the base isolation layer). In some embodiments, a single transistor has a single bridge connection thereto. In some embodiments, a single transistor has two bridge connections. In some embodiments, the two bridge connections to a single transistor are at a same side of the channel bar of the transistor. In some embodiments, the two bridge connections to a single transistor are at opposite sides of the channel bar of the transistor.

A bypass connector as described herein [1] occupies a position in a semiconductor device layout which is immediately adjacent to a transistor active area, or [2] is separated from a transistor active area by one or more circuit elements while connecting conductive lines at opposite sides of the base isolation layer. In some embodiments, a bridge pillar is laterally aligned with a major axis of a transistor SD electrode. In some embodiments, the bridge pillar is offset from a major axis of the transistor SD electrode.

Method 1000 includes an operation 1002 which includes steps associated with depositing a base isolation layer. A base isolation layer comprises a layer of dielectric material which electrically isolates the SD electrodes of a transistor at one side of the base isolation layer from a transistor at the opposite side of the transistor. In some embodiments, the base isolation layer is a silicon dioxide ($SiO_2$) layer. In some embodiments, the base isolation layer is a layer of low-k dielectric material. In some embodiments, the base isolation layer is deposited by a chemical vapor deposition (CVD) process, a physical vapor deposition (PVD) process, an atomic layer deposition (ALD) process, a spin-on deposition process, or some other process of depositing dielectric material onto a substrate.

According to some embodiments, the base isolation layer has a thickness which ranges from about 5 times the vertical thickness of the transistor channel bar to about 30 times the vertical thickness of the channel bar. For base isolation layer thicknesses less than about 5 times the vertical thickness of the transistor channel bar, transistor cross-talk influences switching speed of the semiconductor device. For base isolation layer thicknesses greater than about 20 times the vertical thickness of the transistor channel bar, the aspect ratio of the bridge pillar is sufficiently large that manufacturing processes face problems filling the bridge pillar opening through the base isolation layer (see, e.g., the fill problems described below for FIGS. 11A-11B).

Method 1000 includes an operation 1004, which further includes steps for manufacturing a bridge pillar through the base isolation layer. Steps for manufacturing a bridge pillar through the base isolation layer include steps for: [1] depositing a layer of patterning material over the base isolation layer (including, in some instances, depositing antireflective layers, photoresist materials, and so forth); [2] transferring a pattern to the layer of patterning material by photolithography, ultraviolet (UV) lithography, or some other pattern transfer technique suitable for semiconductor manufacturing which includes single-patterning lithography or multiple-patterning lithography techniques; [3] performing an etch process through an opening in the layer of patterning material. In performing an etch process through the opening in the layer of patterning material, a bridge pillar opening is formed through the entirety of the base isolation layer in order to make an electrical contact with an metal electrode or SD electrode at the other side of the base isolation layer from the side having layer of patterning material during the etch process to form the bridge pillar opening. According to some embodiments, the bridge pillar opening has a sidewall angle of between 70° and 90° (e.g., 70°≤θ≤90°). Sidewall angles smaller than about 70° result in smaller areas at the bottom of the openings formed, resulting in higher resistance in the segmented interconnect structures being manufactured. Sidewall angles larger than about 90° are associated with fill problems in the openings, such as, e.g., uneven liner material coverage on the sidewalls or a higher frequency of void formation during deposition of fill material.

Steps for manufacturing a bridge pillar through the base isolation layer include steps for depositing a layer of liner material (bridge pillar liner material) on the sidewalls of the base isolation layer within the bridge pillar opening. In some embodiments, the layer of liner material is also deposited on a substrate exposed at the bottom of the base isolation layer after forming the bridge opening. In some embodiments, the layer of liner material includes a liner material such as titanium nitride (TiN), titanium (Ti), ruthenium (Ru), cobalt (Co), tantalum (Ta), tantalum nitride (TaN), or alloys thereof, or other liner materials compatible with the dielectric material of the base isolation layer and a bridge pillar fill material (as described below). Liner material deposited on the substrate at the bottom of the base isolation layer is suitable for use as a endpoint material during, e.g., a chemical mechanical polishing (CMP) process which removes the substrate and exposes the base isolation layer (e.g., the bottom side of the base isolation layer) for manufacturing of a second transistor at the second/bottom side of the base isolation layer, and electrically connected to the bridge pillar.

Steps for manufacturing a bridge pillar through the base isolation layer include steps for depositing a bridge pillar fill material over the bridge pillar liner material. A bridge pillar fill material comprises cobalt (Co), tungsten (W), copper (Cu), ruthenium (Ru), titanium (Ti), tantalum (Ta), or alloys thereof, or other conductive materials which are suitable for diffusion, sputtering, or some other deposition technique, into bridge pillar openings.

Method 1000 includes an operation 1006, which further includes steps for manufacturing a first channel bar of a first transistor. In some embodiments, steps for manufacturing a first channel bar of a first transistor include steps of depositing a first layer of dielectric material over the base isolation layer, etching an opening in the layer of dielectric material, and depositing channel material into the opening in the layer of dielectric material. In some embodiments, steps for manufacturing a first channel bar include depositing a first layer of dielectric material over the base isolation layer, depositing alternating layers of channel material and sacrificial material over the layer of dielectric material, depositing a layer of patterning material over the alternating layers of channel material and sacrificial material, and trimming the alternating layers of channel material and sacrificial material to form the channel bar, and covering the channel bar with a second layer of dielectric material to cover and support the channel bar.

Method 1000 includes an operation 1008, which further includes steps for manufacturing source and drain (SD) electrodes of the first transistor. In some embodiments, the SD electrodes are formed by performing an etch process through dielectric material deposited during operation 1006 to expose a circumference of the channel bar at either side of the middle of the first channel bar). In some embodiments, a deposition process is performed to deposit a SD liner material in the SD electrode openings thus formed. In some embodiments, the SD electrode liner material comprises titanium nitride (TiN), titanium (Ti), ruthenium (Ru), cobalt (Co), tantalum (Ta), tantalum nitride (TaN), or alloys thereof, or other liner material compatible with the dielectric material in the semiconductor device at the transistor level. In some embodiments, an SD fill material is deposited over the SD liner material in the SD electrode openings by, e.g., diffusion, sputtering, or some other deposition technique. In some embodiments, SD fill material comprises cobalt (Co), tungsten (W), copper (Cu), ruthenium (Ru), titanium (Ti), tantalum (Ta), or alloys thereof, or other conductive materials which are suitable for a transistor SD electrode.

Method 1000 includes an optional operation 1010, which further includes steps for manufacturing a first metal electrode electrically connected to the bridge pillar. In some embodiments, a metal electrode in a layer of dielectric material is manufactured simultaneously with the SD electrodes located in the same layer of dielectric material. Thus, a metal electrode opening at one side of the base isolation layer is formed during the same etch process which forms the SD electrode openings as described in operation 1008. Metal electrodes manufactured during optional operation 1010 are formed by depositing an metal electrode liner material in the metal electrode openings, wherein the metal electrode liner material comprises titanium nitride (TiN), titanium (Ti), ruthenium (Ru), cobalt (Co), tantalum (Ta), tantalum nitride (TaN), or alloys thereof, or other liner material compatible with the dielectric material in the semiconductor device in proximity to a transistor. A metal electrode fill material is deposited over the metal electrode liner material and comprises cobalt (Co), tungsten (W), copper (Cu), ruthenium (Ru), titanium (Ti), tantalum (Ta), or alloys thereof, or other conductive materials which are suitable for a transistor SD electrode.

In a semiconductor device, some transistors have no electrical connection to a bridge pillar and a metal electrode, and some transistors have one electrical connection to a metal electrode and a bridge pillar. In some embodiments, transistors have two electrical connections to two metal electrodes and two bridge pillars. In embodiments where a top transistor (see operations 1006 and 1008) electrically connects to a conductive line at the bottom side of the base isolation layer, a metal electrode is manufactured in conjunction with transistors at the bottom side of the base isolation layer. Operation 1010 is omitted for a transistor SD electrode where the SD electrode extends laterally to make a direct electrical connection with a bridge pillar. A first non-limiting example of a transistor having a SD electrode which extends laterally to make a direct electrical connection with a bridge pillar is transistor 291 of semiconductor device 200, where bridge pillar 238 directly electrically connects to SD electrode 202, and metal electrode 236 electrically connects bridge pillar 238 to contact 234. For semiconductor device 200, metal electrode 236 is formed by operation 1016 of method 1000, and operation 1010 is omitted. A second non-limiting example of a transistor having a SD electrode which extends laterally to make a direct electrical connection with a bridge pillar is transistor 791 of semiconductor device 700, where SD electrode 702 electrically connects to bridge pillar 738, and metal electrode 721 at the opposite side of base isolation layer 705A from SD electrode 702 electrically connects bridge pillar 738 to contact 730B.

Method 1000 includes an operation 1012, which further includes steps for manufacturing a second channel bar of a second transistor. In some embodiments, steps for manufacturing a second channel bar of a second transistor include steps of depositing a third layer of dielectric material against the base isolation layer, etching an opening in the third layer of dielectric material, and depositing channel material into the opening in the third layer of dielectric material. In some embodiments, steps for manufacturing a second channel bar include depositing a third layer of dielectric material against the base isolation layer, depositing alternating layers of channel material and sacrificial material above the layer of dielectric material, depositing a layer of patterning material above the alternating layers of channel material and sacrificial material, and trimming the alternating layers of channel material and sacrificial material to form the channel bar, and covering the channel bar with a fourth layer of dielectric material to cover and support the channel bar. In some embodiments, steps for manufacturing a second channel bar of a second transistor further comprise performing an etch process to expose a middle portion of the second channel bar and forming a gate dielectric material on the channel material. In some embodiments, steps for manufacturing a second channel bar further include selectively removing the sacrificial material from between layers of channel material prior to forming the gate dielectric material on the channel material. In some embodiments, the gate dielectric material is formed by oxidizing the channel material. In some embodiments, the gate dielectric material is formed by performing an atomic layer deposition (ALD) process, or some other deposition technique.

Method 1000 includes an operation 1014, which further includes steps for manufacturing SD electrodes of the second transistor. In some embodiments, the SD electrodes are formed by performing an etch process through dielectric material deposited during operation 1012 to expose a circumference of the second channel bar at either side of the middle of the second channel bar. In some embodiments, a deposition process is performed to deposit a SD liner material in the SD electrode openings thus formed. In some embodiments, the SD electrode liner material comprises titanium nitride (TiN), titanium (Ti), ruthenium (Ru), cobalt (Co), tantalum (Ta), tantalum nitride (TaN), or alloys thereof, or other liner material compatible with the dielectric material in the semiconductor device at the transistor level. In some embodiments, an SD fill material is deposited over the SD liner material in the SD electrode openings by, e.g., diffusion, sputtering, or some other deposition technique. In some embodiments, SD fill material comprises cobalt (Co), tungsten (W), copper (Cu), ruthenium (Ru), titanium (Ti), tantalum (Ta), or alloys thereof, or other conductive materials which are suitable for a transistor SD electrode.

Method 1000 includes an optional operation 1016, which further includes steps for manufacturing a second metal electrode. In some embodiments, a metal electrode in a layer of dielectric material is manufactured simultaneously with the SD electrodes located in the same layer of dielectric material. Thus, a metal electrode opening at one side of the base isolation layer is formed during the same etch process which forms the SD electrode openings as described in operation 1008. Metal electrodes manufactured during optional operation 1010 are formed by depositing a metal electrode liner material in the metal electrode openings, wherein the metal electrode liner material comprises titanium nitride (TiN), titanium (Ti), ruthenium (Ru), cobalt (Co), tantalum (Ta), tantalum nitride (TaN), or alloys thereof, or other liner material compatible with the dielectric material in the semiconductor device in proximity to a transistor. A metal electrode fill material is deposited over the metal electrode liner material and comprises cobalt (Co), tungsten (W), copper (Cu), ruthenium (Ru), titanium (Ti), tantalum (Ta), or alloys thereof, or other conductive materials which are suitable for a transistor SD electrode.

In a semiconductor device, some transistors have no electrical connection to a bridge pillar and a metal electrode, and some transistors have one electrical connection to a metal electrode and a bridge pillar. In some embodiments, transistors have two electrical connections to two metal electrodes and two bridge pillars. In embodiments where a bottom transistor (see operation 1012 and 1014) electrically connects to a conductive line at the top side of the base isolation layer, a metal electrode is manufactured in conjunction with transistors at the top side of the base isolation layer. Operation 1016 is omitted for a transistor SD electrode where the SD electrode extends laterally to make a direct electrical connection with a bridge pillar. A first non-limiting example of a transistor having a SD electrode which extends laterally to make a direct electrical connection with a bridge pillar is transistor 392 of semiconductor device 300, where bridge pillar 322 directly electrically connects to SD electrode 326, and metal electrode 320 electrically connects bridge pillar 322 to contact 318. For semiconductor device 300, metal electrode 320 is formed by operation 1010 of method 1000, and operation 1016 is omitted. A second non-limiting example of a transistor having a SD electrode which extends laterally to make a direct electrical connection with a bridge pillar is transistor 892 of semiconductor device 800, where SD electrode 826 electrically connects to bridge pillar 822, and metal electrode 820 at the opposite side of base isolation layer 805A from SD electrode 826 electrically connects bridge pillar 822 to contact 819.

In some embodiments, operation 1010 and operation 1016 are performed next to transistors in a semiconductor device where the transistors are not electrically connected to a bridge pillar at either side of the base isolation layer. These "dummy" metal electrode are used to adjust pattern density of the etch process which is used to form the metal electrodes across a semiconductor device, and/or to adjust the pattern density of the etch process which is used to form the SD electrodes of transistors. By adjusting the pattern density across a semiconductor device, loading effects are reduced and etch profiles of the SD electrodes and/or metal electrode (in addition to the "dummy" metal electrodes) are less likely to undergo lateral deviations during an etch process, or less likely to experience unexpected taper or sidewall angle variations during the etch process.

Method 1000 includes an operation 1018, which further includes steps for manufacturing a gate electrode for the first transistor. Steps for manufacturing a gate electrode include steps for: [1] depositing a layer of patterning material over the dielectric material which covers and supports a channel bar (see, e.g., operations 1006 and/or 1012) which also including, in some instances, depositing antireflective layers, photoresist materials, and so forth); [2] transferring a pattern to the layer of patterning material by photolithography, ultraviolet (UV) lithography, or some other pattern transfer technique suitable for semiconductor manufacturing which includes single-patterning lithography or multiple-patterning lithography techniques; [3] performing an etch process through an opening in the layer of patterning material. In some embodiments, in performing the etch process of operation 1018, the etch process exposes the circumference of the first channel bar. In some embodiments, in performing the etch process of operation 1018, the etch process exposes the base isolation layer below the first channel bar.

In some embodiments, steps for manufacturing a gate electrode for the first transistor include performing an etch process to expose a middle portion of the first channel bar and forming a gate dielectric material on the channel material. In some embodiments, steps for manufacturing a gate electrode for the first transistor include selectively removing the sacrificial material from between layers of channel material prior to forming the gate dielectric material on the channel material. In some embodiments, the gate dielectric material is formed by oxidizing the channel material. In some embodiments, the gate dielectric material is formed by performing an atomic layer deposition (ALD) process, or some other deposition technique.

Steps for manufacturing a gate electrode for the first transistor include performing a deposition process to add gate electrode material to the opening formed in the dielectric material, and against the gate dielectric material on the first channel bar. In some embodiments, the gate electrode material is made of a semiconductor material such as polysilicon. In some embodiments, the gate electrode material is added by a CVD or PVD process which deposits the semiconductor material in the gate electrode opening.

Method 1000 includes an operation 1020, which further includes steps for manufacturing a gate electrode for the second transistor. In some embodiments, a single gate electrode is used to operate both a first transistor at one side of the base isolation layer and a second transistor at the opposite side of the base isolation layer from the first transistor. In embodiments where a single transistor operates both a first transistor and a second transistor at opposite sides of a single location of the base isolation layer, the process of etching through dielectric material described in operation is performed to additionally expose the second channel bar of the second transistor. Further, forming gate dielectric material is performed on both the first channel bar and the second channel bar in a same process step. In some embodiments, adding gate electrode material is performed to add material against both the first channel bar and the second channel bar in a same process step.

In some embodiments, a second transistor has a second gate electrode different from the gate electrode of the first transistor at the opposite side of the base isolation layer, and the steps of operation 1018 are repeated at the same side of the semiconductor device as the second channel bar, without interfering with the first transistor or the first transistor gate electrode.

Method 1000 includes an operation 1022, which further includes steps for manufacturing transistor contacts. Transistor contacts at the top and bottom of the base isolation layer (e.g., contacts to the SD electrodes of a transistor, or the gate electrode), are manufactured by [1] depositing a layer of dielectric material over the first transistor or second transistor, [2] depositing a layer of patterning material over the dielectric material (which also including, in some instances, depositing antireflective layers, photoresist materials, and so forth); [3] transferring a pattern to the layer of patterning material by photolithography, ultraviolet (UV) lithography, or some other pattern transfer technique suitable for semiconductor manufacturing which includes single-patterning lithography or multiple-patterning lithography techniques; [4] performing an etch process through an opening in the layer of patterning material through the dielectric material to expose the SD electrodes and/or the gate electrode of the first transistor or second transistor. Contacts for the first transistor are manufactured separately from the contacts for the second transistor. In some embodiments, contacts are filled with a contact liner material and a contact fill material separately from conductive lines of the semiconductor device. In some embodiments, contacts are filled with a contact liner material and a contact fill material in conjunction with filling of the conductive lines of the semiconductor device.

Method 1000 includes an operation 1024, which further includes steps for manufacturing conductive lines to the transistor contacts. Conductive lines (e.g., M0 or BM0 lines, as described above) are formed by etching trenches into the conductive material over the transistors and filling the trenches with liner material and conductive material. In some embodiments, operation 1024 is performed after operation 1022. In some embodiments, operation 1022 is performed after operation 1024.

A segmented interconnect structure (e.g., a bypass connection or a bookmark) between conductive lines at one side of a base isolation layer, and either an SD electrode or a conductive line at the other side of the base isolation layer, both increases the density of transistors of the semiconductor device, and reduces the resistance of the semiconductor device. The transistor density increase is related to the greater efficiency of routing signals and/or power across the base isolation layer of the semiconductor device.

The reduced resistance is due to [1] a larger interface area at each interface of portions of the segmented interconnect structure, in comparison to interconnect structures with monolithic tall vias. A monolithic tall via is a single via which extends from a conductive line at one side of the base isolation layer to a conductive line or transistor SD electrode at the other side of the base isolation structure. Monolithic vias have a large top opening and a small bottom opening because of process limitations on the sidewall angle for the monolithic via opening. Contact resistance decrease with increasing interface area at the top or bottom of a contact. Thus, the small bottom opening of a monolithic via has a higher contact resistance than the resistance of a segmented interconnect structure, where each portion of the interconnect structure is shorter than the monolithic via, and the amount of taper for each portion of the segmented interconnect structure is smaller than the taper for the monolithic via.

Figure 11B:
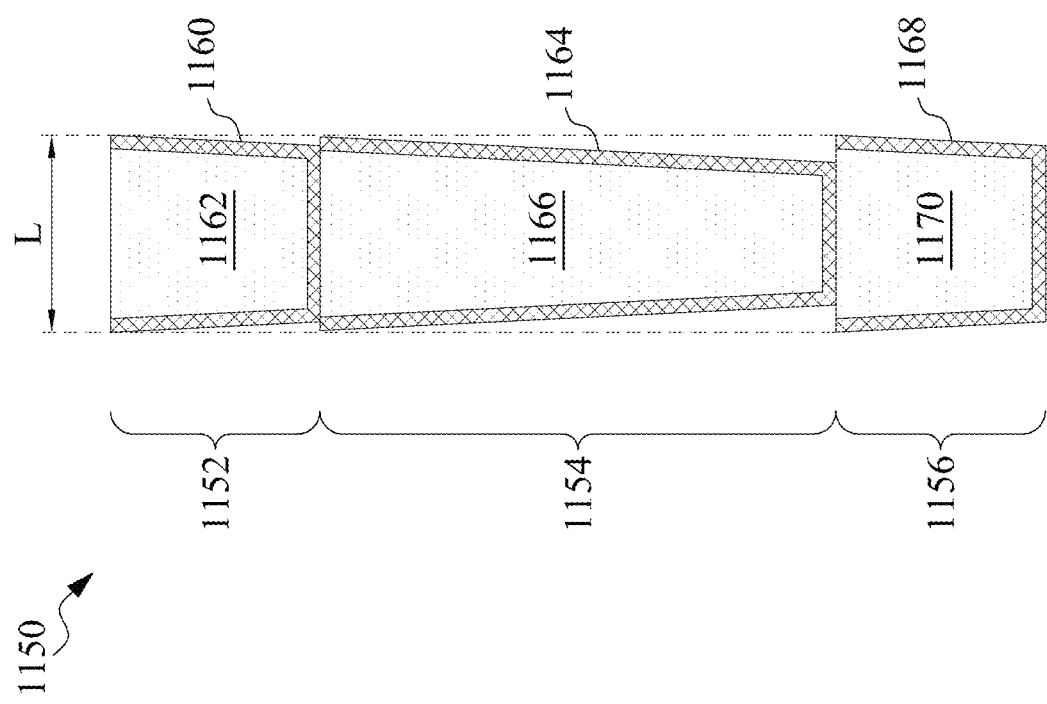

FIGS. 11A-11B are cross-sectional views of a segmented interconnect structure of a semiconductor device in accordance with some embodiments. In FIG. 11A, the segmented interconnect structure 1100 includes a first segment 1102, a second segment 1104, and a third segment 1106. When performing etch processes to form the segments of a segmented interconnect structure, whether a bridge connection or a bypass connection as described above, the etch processes used to form openings through the various dielectric materials, whether base isolation layer or another dielectric material, have a sidewall angle theta (θ) measured, with respect to the top surface of the dielectric material. In some embodiments, sidewall angle theta ranges from 70° to 90° (e.g., 70°≤sidewall angle theta≤90°), although other sidewall angles are also within the scope of the present disclosure.

For purposes of simplicity, the top dimension and the sidewall angle theta are treated as the same for each segment of the segmented interconnect structure. The top dimension L of a segment of the segmented interconnect structure is determined by the patterning precision of the method used to form openings in a dielectric material (e.g., the photolithography or UV lithography process). For purposes of the discussion herein, each segment is treated as having the same top dimension L. In some embodiments, the top dimension is different in different directions along the interface between segments of the segmented interconnect structure. Thus, first segment 1102 has a top dimension L, a height H1, a sidewall angle theta, and a bottom dimension W2; second segment 1104 has a top dimension L, a height H2, a sidewall angle theta, and a bottom dimension W3; and third segment 1106 has a top dimension L, a sidewall angle theta, a height H3, and a bottom dimension W4. The initial width (W1) of the segmented interconnect structure 1100 is thus:

$$W1=L \quad \text{(Equation 1)};$$

the bottom dimension of the first segment 1102 is:

$$W2 = \left[L - \frac{2H1}{\tan\phi}\right]; \quad \text{(Equation 2)}$$

the bottom dimension of the second segment 1104 is:

$$W3 = \left[L - \frac{2H2}{\tan\phi}\right]; \quad \text{(Equation 3)}$$

and the bottom dimension of the third segment 1106 is:

$$W4 = \left[L - \frac{2H3}{\tan\phi}\right]. \quad \text{(Equation 4)}$$

Each of W2, W3, and W4 is larger than the bottom dimension ($W_{monolithic}$) of a monolithic via:

$$Wmonolithic = \left[L - \frac{2(D1)}{\tan\phi}\right], \quad \text{(Equation 5)}$$

where D1 (equivalent monolithic via height)=H1+H2+H3.

As the contact resistance is proportion to the area of a contact interface, rather than the bottom dimension (e.g., contact width), the benefits of a segmented interconnect structure as described herein become increasingly apparent?

According to some embodiments, the total height of the segmented interconnect (D1, or the height of an equivalent monolithic via), is equal to the sum of the individual portions of the segmented interconnect (D1=H1+H2+H3), and ranges from 10 to 35 times HC (see FIG. 2, semiconductor 200), the vertical thickness of the channel bar of a transistor in the semiconductor device (see FIG. 9). For embodiments with D1<10*HC, the base isolation layer becomes prone to delamination, resulting in reduced yield. For embodiments with D1>35*HC, the aspect ration of each of the portions of a segmented interconnect structure becomes sufficiently large that etching the bridge pillar becomes difficult and the contact resistance increases beyond a design specification for a semiconductor device.

FIG. 11B is a cross-sectional view of a segmented interconnect structure 1150 with three interconnect portions therein: first portion 1152, second portion 1154, and third portion 1156. First portion 1152, second portion 1154, and third portion 1156 each include a liner and a fill material.

Manufacture of the portions of a segmented interconnect structure (e.g., the metal electrodes and bridge pillars of a semiconductor device) are described above in operation 1004 and optional operations 1010 and 1016 of method 1000.

First portion 1152 includes a first liner 1160 and a first fill material 1162. Second portion 1154 includes a second liner 1162 and a second fill material 1164. Third portion 1156 includes a third liner 1168 and a third fill material 1170.

According to some embodiments, the first portion is a metal electrode at a first side of a base isolation layer, the third portion is a metal electrode at a second side of the base isolation layer, and the second portion is a bridge pillar extending through a base isolation layer. In some embodiments (see, e.g., semiconductor devices 600-900, above) one of the end portions (e.g., one of the metal electrodes) is omitted from the segmented interconnect structure.

In some embodiments, the liners for each portion are manufactured using the same liner material. In some embodiments, the liners for the first portion and the third portion are manufactured using the same liner material and the liner for the second portion is manufactured using a different material. In some embodiments, the fill material for all of the portions are manufactured with a same material. In some embodiments, the fill material for the first and third portions are the same material and the fill material for the second portion is a different material.

By manufacturing the segmented interconnect structure in portions, the fill problems with tall or monolithic vias are reduced. For example, liner deposition in a short portion of a segmented interconnect structure is less prone to overfilling at the bottom (where the liner plugs the end of the portion) is less likely than for a monolithic via. Overfilling of a monolithic via results in increased resistance for the semiconductor device, reducing switching speed and increasing power consumption. Further, depositing a fill material is easier for a short portion of a segmented interconnect structure than for a monolithic via because there is a reduced likelihood of forming a void during filling. Voids result in increased power consumption and increased resistance, and also increase the likelihood of device failure by electromigration. Depositing liners into short portions of a segmented interconnect structure as described herein is associated with more conformal liner layers, and tighter distributions of transistor switching speeds across the semiconductor device.

Figure 12:
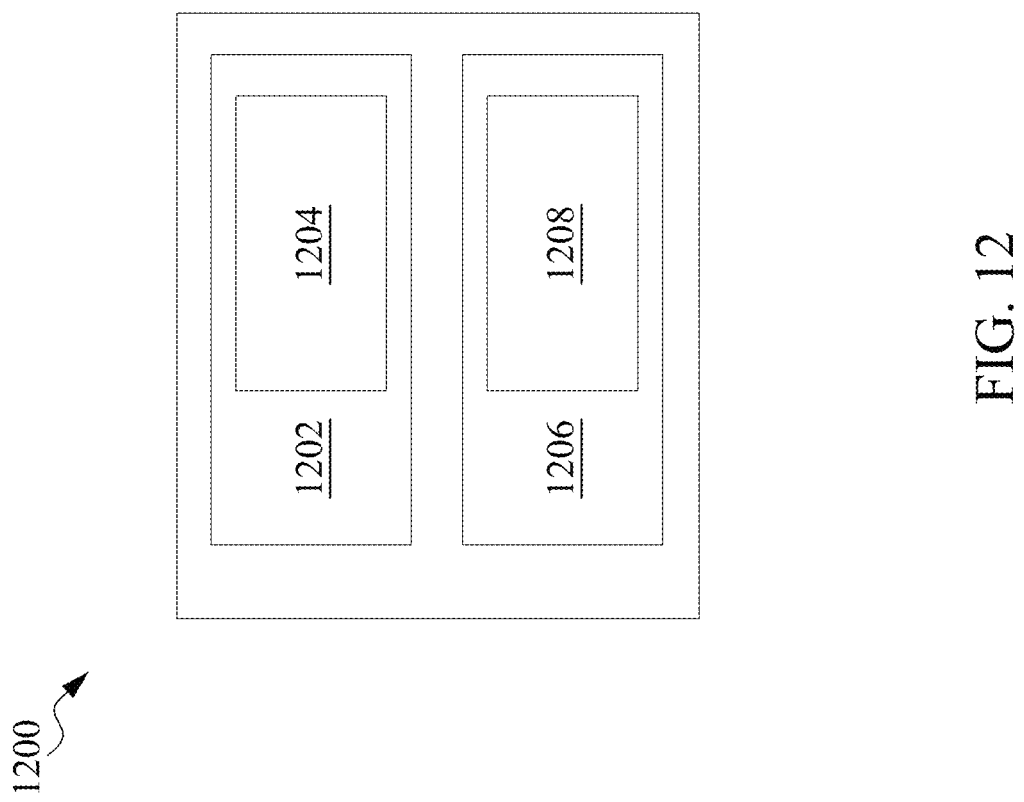
FIG. 12 is a block diagram of a semiconductor device in accordance with some embodiments.

FIG. 12 is a block diagram of a semiconductor device 1200 in accordance with at least one embodiment of the present disclosure.

In FIG. 12, semiconductor device 1200 includes, among other things, a circuit macro (hereinafter, macro) 1202 and a macro 1206. In some embodiments, macro 1202 is a macro for a gate-all-around (GAA) transistor. Macro 1202 includes, among other things, a wire routing arrangement 1204. Example of cross-sectional views of a GAA transistor of macro 1202 and a wire routing arrangement 1204 include the views in each of each of FIGS. 1-5 described above. In some embodiments, macro 1206 is a macro for a transistor with a channel bar against one side of an SD electrode. Macro 1206 includes, among other things, a wire routing arrangement 1208. Example of views of a transistor with a channel bar against one side of an SD electrode and a wire routing arrangement 1208 include the routing arrangement layout diagrams in each of each of FIGS. 6-9 described above.

Figure 13:
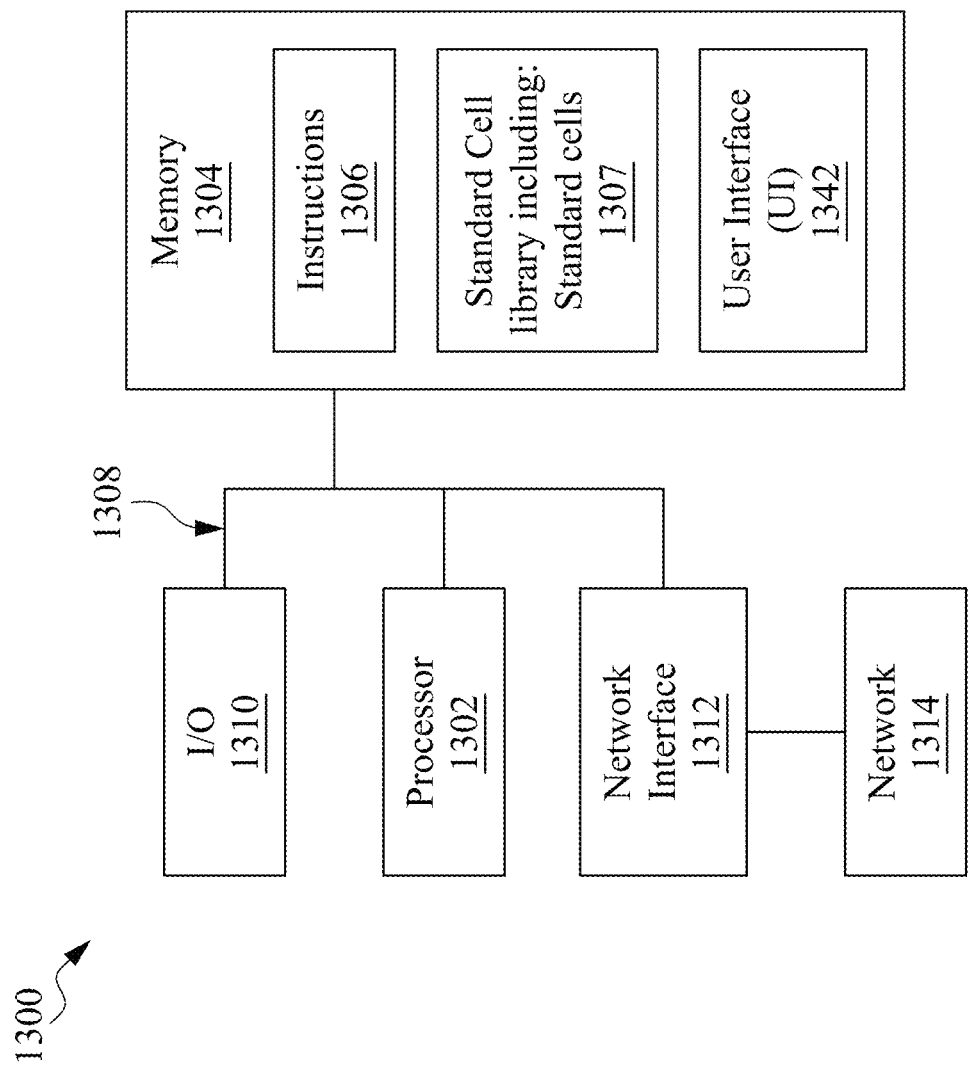
FIG. 13 is a block diagram of an electronic design automation (EDA) system in accordance with some embodiments.

FIG. 13 is a block diagram of an electronic design automation (EDA) system 1300 in accordance with some embodiments.

In some embodiments, EDA system 1300 includes an APR system. Methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including a processor 1302 and a non-transitory, computer-readable storage medium 1304. Computer-readable storage medium 1304 is, amongst other things, encoded with, i.e., stores, computer program code 1306, i.e., a set of executable instructions. Execution of computer program code 1306 by processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause EDA system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause EDA system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells as disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows EDA system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1300.

EDA system 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in storage medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
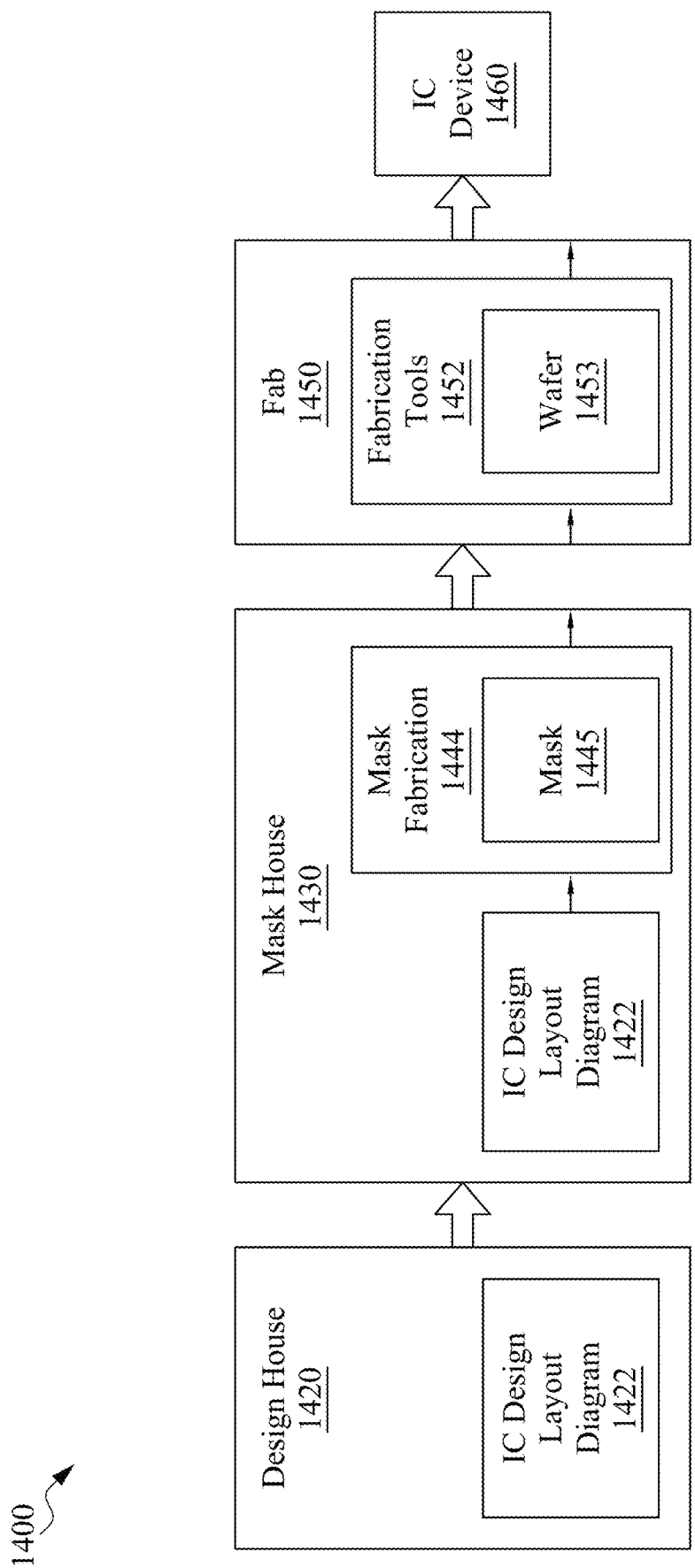
FIG. 14 is a block diagram of an integrated circuit (IC) manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in IC manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or a design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain region of the channel bar, source electrode, and drain electrode, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes mask data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, mask data preparation 1432 includes additional features such as a logic operation (LOP) to modify the IC design layout diagram 1422 according to manufacturing rules. Additionally, the processes applied to IC design layout diagram 1422 during mask data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

Details regarding an integrated circuit (IC) manufacturing system (e.g., EDA system 1300 of FIG. 13), and an IC manufacturing flow associated therewith are found, e.g., in U.S. Pat. No. 9,256,709, granted Feb. 9, 2016, U.S. Pre-Grant Publication No. 20178429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Aspects of the present disclosure relate to a semiconductor device which includes a base isolation layer; a first transistor on a first side of the base isolation layer, the first transistor having a first transistor source electrode; a second transistor on a second side of the base isolation layer, the second transistor having a second transistor source electrode, wherein the first transistor is spaced from the second transistor in a first direction; a metal electrode separated from the second transistor source electrode in a second direction perpendicular to the first direction; and a bridge pillar separated from the first transistor source electrode and the second transistor source electrode in a second direction perpendicular to the first direction, the bridge pillar extending through the base isolation layer and electrically connecting the first transistor source electrode to the metal electrode. In some embodiments, the device further includes a conductive line on the second side of the base isolation layer, wherein the second transistor source electrode is closer than the conductive line to the base isolation layer; and a via electrically connected to the conductive line at the second side of the base isolation layer, wherein the via is vertically aligned with and electrically connects the conductive line to the metal electrode. In some embodiments, the bridge pillar further includes a liner material separating the base isolation layer from a first conductive material. In some embodiments, the first conductive material includes titanium, tantalum, nickel, cobalt, tungsten, copper, ruthenium, and/or alloys thereof. In some embodiments, the second transistor source electrode and the metal electrode include a second conductive material. In some embodiments, the second conductive material includes titanium, tantalum, nickel, cobalt, tungsten, copper, ruthenium, and alloys thereof. In some embodiments, the first conductive material is different from the second conductive material. In some embodiments, the semiconductor device includes a channel bar, and wherein the first transistor source electrode extends around the channel bar.

Aspects of the present disclosure relate to a method of making a semiconductor device which includes operations for depositing a base isolation layer; manufacturing a first bridge pillar extending through the base isolation layer; manufacturing a first transistor on a first side of the base isolation layer by manufacturing a first transistor channel bar, and manufacturing a first transistor source/drain electrode (SD electrode), wherein the first transistor SD electrode electrically connects to the bridge pillar on the first side of the base isolation layer; manufacturing a first metal electrode on a second side of the base isolation layer, wherein the first metal electrode electrically connects to the first bridge pillar on the second side of the base isolation layer; and manufacturing a first via electrically connected to the first metal electrode; and manufacturing a first conductive line electrically connected to the first via. In some embodiments, the method includes operations for manufacturing a second via on the first side of the base isolation layer, wherein the second via electrically connects to the first transistor SD electrode; and manufacturing a second conductive line electrically connected to the second via. In some embodiments, the method includes steps for manufacturing a second transistor on the second side of the base isolation layer by manufacturing a second transistor channel bar, and manufacturing a second transistor SD electrode; manufacturing a second bridge pillar extending through the base isolation layer; and manufacturing a second metal electrode at the first side of the base isolation layer and electrically connected to the second bridge pillar. In some embodiments, the method includes an operation for manufacturing a gate electrode around a middle portion of the first transistor channel and a middle portion of the second transistor channel. In some embodiments, the method includes operations for manufacturing a first gate electrode around a middle portion of the first transistor channel and a second gate electrode around a middle portion of the second transistor channel. In some embodiments of the method, the first transistor SD electrode and the second metal electrode are manufactured with a same metal deposition process.

Aspects of the present disclosure relate to a semiconductor device which includes a substrate; a bridge pillar extending through the substrate; a first dielectric material on a first side of the substrate; a second dielectric material on a second side of the substrate; a first transistor in the first dielectric material and having a first source/drain (SD) electrode on the first side of the substrate; a second transistor in the second dielectric material and having a second SD electrode on the second side of the substrate; a first metal electrode extending through the first dielectric material and electrically connecting to a first end of the bridge pillar, wherein the first metal electrode and the first SD electrode have a same first dimension in a direction perpendicular to the first side of the substrate; and a second metal electrode extending through the second dielectric material and electrically connecting to a second end of the bridge pillar. In some embodiments, the second metal electrode and the second SD electrode have a same second dimension extending away from the second side of the substrate. In some embodiments, the bridge pillar includes titanium, tantalum, nickel, cobalt, tungsten, copper, ruthenium, and alloys thereof. In some embodiments, the semiconductor device includes a first metal electrode liner between the first dielectric material and the first metal electrode; and a second metal electrode liner between the second dielectric material and the second metal electrode. In some embodiments, the first metal electrode includes a first material and the second metal electrode includes a second material different from the first material. In some embodiments, the first material and the second material independently include titanium, tantalum, nickel, cobalt, tungsten, copper, ruthenium, and alloys thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a base isolation layer;
   a first transistor on a first side of the base isolation layer, the first transistor having a first transistor source/drain (S/D) electrode;
   a second transistor on a second side of the base isolation layer, the second transistor having a second transistor S/D electrode, wherein the first transistor S/D electrode is spaced from the second transistor S/D electrode by a first height in a first direction;
   a metal electrode separated from the second transistor S/D electrode in a second direction perpendicular to the first direction; and
   a bridge pillar separated from the second transistor S/D electrode in the second direction, the bridge pillar extending through the base isolation layer, having a height in the first direction substantially equal to the first height, and electrically connecting the first transistor S/D electrode to the metal electrode.

2. The semiconductor device of claim 1, further comprising a conductive line on the second side of the base isolation layer, wherein the second transistor S/D electrode is closer than the conductive line to the base isolation layer; and
   a via electrically connected to the conductive line at the second side of the base isolation layer, wherein the via is vertically aligned with and electrically connects the conductive line to the metal electrode.

3. The semiconductor device of claim 2, wherein the bridge pillar further comprises a liner material separating the base isolation layer from a first conductive material.

4. The semiconductor device of claim 3, wherein the first conductive material comprises titanium, tantalum, nickel, cobalt, tungsten, copper, ruthenium, and alloys thereof.

5. The semiconductor device of claim 4, wherein the second transistor S/D electrode and the metal electrode comprise a second conductive material.

6. The semiconductor device of claim 5, wherein the second conductive material comprises titanium, tantalum, nickel, cobalt, tungsten, copper, ruthenium, and alloys thereof.

7. The semiconductor device of claim 5, wherein the first conductive material is different from the second conductive material.

8. The semiconductor device of claim 1, further comprising a channel bar, and wherein the first transistor S/D electrode extends around the channel bar.

9. A semiconductor device, comprising:
   a substrate;
   a bridge pillar extending through the substrate;
   a first dielectric material on a first side of the substrate;
   a second dielectric material on a second side of the substrate;
   a first transistor in the first dielectric material and having a first source/drain (SD) electrode on the first side of the substrate;
   a second transistor in the second dielectric material and having a second SD electrode on the second side of the substrate;
   a first metal electrode extending through the first dielectric material and electrically connecting to a first end of the bridge pillar, wherein the first metal electrode and the first SD electrode have a same first dimension in a direction perpendicular to the first side of the substrate; and
   a second metal electrode extending through the second dielectric material and electrically connecting to a second end of the bridge pillar.

10. The semiconductor device of claim 9, wherein the second metal electrode and the second SD electrode have a same second dimension extending away from the second side of the substrate.

11. The semiconductor device of claim 9, wherein the bridge pillar comprises titanium, tantalum, nickel, cobalt, tungsten, copper, ruthenium, and alloys thereof.

12. The semiconductor device of claim 9, further comprising:
   a first metal electrode liner between the first dielectric material and the first metal electrode; and
   a second metal electrode liner between the second dielectric material and the second metal electrode.

13. The semiconductor device of claim 9, wherein the first metal electrode comprises a first material and the second metal electrode comprises a second material different from the first material.

14. The semiconductor device of claim 13, wherein the first material and the second material independently comprise titanium, tantalum, nickel, cobalt, tungsten, copper, ruthenium, and alloys thereof.

15. A semiconductor device, comprising:
a base isolation layer;
a first transistor on a first side of the base isolation layer, wherein the first transistor comprises a first source/drain (S/D) electrode;
a second transistor on a second side of the base isolation layer, wherein the second side is opposite the first side, and the second transistor comprises a second S/D electrode;
a first conductive line on the second side of the base isolation layer, wherein the second transistor is closer to the base isolation layer than the first conductive line; and
a first conductive structure electrically connecting the first S/D electrode to the first conductive line, wherein the first conductive structure extends in a first direction through the base isolation layer, is spaced apart from the second S/D electrode in a second direction perpendicular to the first direction, and is overlapped by the first S/D electrode in the second direction.

16. The semiconductor device of claim 15, wherein a dimension of the first S/D electrode in a direction parallel to a surface of the base isolation layer is greater than a dimension of the second S/D electrode in the direction.

17. The semiconductor device of claim 15, wherein the first conductive structure comprises:
a conductive via on the second side of the base isolation layer, wherein the conductive via has a first width; and
a conductive pillar extending through the base isolation layer, wherein the conductive pillar has a second width different from the first width.

18. The semiconductor device of claim 17, wherein the conductive pillar directly contacts the first S/D electrode.

19. The semiconductor device of claim 15, further comprising:
a second conductive line on the first side of the base isolation layer, wherein the first S/D electrode is closer to the base isolation layer than the second conductive line; and
a second conductive structure electrically connecting the second conductive line to the second S/D electrode, wherein the second conductive structure extends through the base isolation layer.

20. The semiconductor device of claim 15, further comprising a second conductive line on the first side of the base isolation layer, wherein the second conductive line is electrically connected to the first conductive line through the first S/D electrode.

* * * * *